(12) United States Patent
Sakai et al.

(10) Patent No.: US 10,209,133 B2
(45) Date of Patent: Feb. 19, 2019

(54) WAVELENGTH ESTIMATION DEVICE, LIGHT-SOURCE DEVICE, IMAGE DISPLAY APPARATUS, OBJECT APPARATUS, WAVELENGTH ESTIMATION METHOD, AND LIGHT-SOURCE CONTROL METHOD

(71) Applicants: Kohji Sakai, Tokyo (JP); Kazuhiro Akatsu, Kanagawa (JP)

(72) Inventors: Kohji Sakai, Tokyo (JP); Kazuhiro Akatsu, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/454,223

(22) Filed: Mar. 9, 2017

(65) Prior Publication Data

US 2017/0276546 A1 Sep. 28, 2017

(30) Foreign Application Priority Data

Mar. 28, 2016 (JP) .................................. 2016-064030
Sep. 7, 2016 (JP) .................................. 2016-174349

(51) Int. Cl.
*G01N 21/00* (2006.01)
*G01J 3/50* (2006.01)
(Continued)

(52) U.S. Cl.
CPC .............. *G01J 3/50* (2013.01); *G01J 3/0264* (2013.01); *G01J 3/0286* (2013.01); *G01J 3/10* (2013.01); *G01J 3/505* (2013.01); *G01J 3/506* (2013.01); *H01S 5/06804* (2013.01); *H01S 5/4093* (2013.01); *H04N 9/3129* (2013.01); *H04N 9/3144* (2013.01); *H04N 9/3155* (2013.01); *H04N 9/3164* (2013.01); *H04N 9/3182* (2013.01); *H04N 9/3194* (2013.01); *G01J 2003/467* (2013.01); *H01S 5/0035* (2013.01); *H01S 5/0617* (2013.01);
(Continued)

(58) Field of Classification Search
CPC .......... G01J 3/02; G01J 3/0264; G01J 3/0286; G01J 3/50; G01J 3/10; G01N 21/64; G01N 21/68; H01J 33/32935
See application file for complete search history.

(56) References Cited

U.S. PATENT DOCUMENTS

| 5,831,758 A | 11/1998 | Sakai et al. |
| 5,999,345 A | 12/1999 | Nakajima et al. |

(Continued)

FOREIGN PATENT DOCUMENTS

| JP | 2003-179298 A | 6/2003 |
| JP | 2010-049232 | 3/2010 |

(Continued)

OTHER PUBLICATIONS

Extended European Search Report dated Aug. 2, 2017 in Patent Application No. 17159441.9.

(Continued)

*Primary Examiner* — Abdullahi Nur
(74) *Attorney, Agent, or Firm* — Oblon, McClelland, Maier & Neustadt, L.L.P.

(57) ABSTRACT

A wavelength estimation device including a light detector to receive light emitted from a light source and an estimation unit. The estimation unit estimates a wavelength of the light based on an amount of light received by the light detector.

17 Claims, 13 Drawing Sheets

(51) Int. Cl.
  *G01J 3/02* (2006.01)
  *G01J 3/10* (2006.01)
  *H01S 5/068* (2006.01)
  *H04N 9/31* (2006.01)
  *G01J 3/46* (2006.01)
  *H01S 5/00* (2006.01)
  *H01S 5/06* (2006.01)
  *H01S 5/0683* (2006.01)
  *H01S 5/40* (2006.01)
  *H05B 33/08* (2006.01)

(52) U.S. Cl.
  CPC ......... *H01S 5/06832* (2013.01); *H01S 5/4012* (2013.01); *H05B 33/0869* (2013.01)

(56) References Cited

U.S. PATENT DOCUMENTS

| | | | |
|---|---|---|---|
| 6,256,133 | B1 | 7/2001 | Suzuki et al. |
| 6,366,384 | B1 | 4/2002 | Aoki et al. |
| RE38,195 | E | 7/2003 | Sakai et al. |
| RE40,109 | E | 2/2008 | Sakai et al. |
| RE45,918 | E | 3/2016 | Saisho et al. |
| 2001/0022343 | A1 | 9/2001 | Sakai et al. |
| 2003/0209659 | A1 | 11/2003 | Sakai et al. |
| 2004/0090520 | A1 | 5/2004 | Sakai et al. |
| 2007/0091398 | A1 | 4/2007 | Ueda et al. |
| 2007/0211324 | A1 | 9/2007 | Sakai et al. |
| 2008/0024589 | A1 | 1/2008 | Ueda et al. |
| 2008/0055692 | A1 | 3/2008 | Saisho et al. |
| 2008/0068689 | A1 | 3/2008 | Saisho et al. |
| 2008/0068693 | A1 | 3/2008 | Hayashi et al. |
| 2009/0002792 | A1 | 1/2009 | Sakai et al. |
| 2009/0059333 | A1 | 3/2009 | Sakai |
| 2009/0206236 | A1 | 8/2009 | Kawashima et al. |
| 2009/0317137 | A1 | 12/2009 | Akatsu et al. |
| 2010/0194843 | A1 | 8/2010 | Sakai et al. |
| 2011/0063594 | A1 | 3/2011 | Sakai |
| 2011/0090549 | A1 | 4/2011 | Sakai |
| 2011/0128602 | A1 | 6/2011 | Hamano et al. |
| 2011/0299104 | A1* | 12/2011 | Seo .................. G01J 3/02 358/1.9 |
| 2012/0050444 | A1 | 3/2012 | Sakai |
| 2012/0098819 | A1* | 4/2012 | Furuya .................. G02B 5/32 345/212 |
| 2012/0104225 | A1 | 5/2012 | McEldowney et al. |
| 2013/0033558 | A1 | 2/2013 | Akatsu et al. |
| 2013/0070323 | A1 | 3/2013 | Tokita et al. |
| 2013/0076851 | A1 | 3/2013 | Watanabe et al. |
| 2013/0155166 | A1 | 6/2013 | Watanabe et al. |
| 2014/0160493 | A1 | 6/2014 | McEldowney et al. |
| 2014/0192331 | A1 | 7/2014 | Toyooka |
| 2015/0346484 | A1 | 12/2015 | Suzuki et al. |
| 2016/0218805 | A1* | 7/2016 | Iizuka .................. H04B 10/116 |
| 2017/0001459 | A1 | 1/2017 | Uehira et al. |

FOREIGN PATENT DOCUMENTS

| | | |
|---|---|---|
| JP | 2014-035386 A | 2/2014 |
| JP | 2015-148665 | 8/2015 |
| WO | WO1994/004894 A1 | 3/1994 |

OTHER PUBLICATIONS

Gerard Harbers et al., "Performance of High Power Light Emitting Diodes in Display Illumination Applications", Journal of Display Technology, vol. 3, No. 2, XP011182138, Jun. 1, 2007, pp. 98-109.
Office Action dated Dec. 14, 2018, in corresponding European Patent Application No. 17159441.9.
Dr. Rüdiger Paschotta, Encyclopedia of Laser Physics and Technology, Mar. 20, 2012, 5 pages.

* cited by examiner

WAVELENGTH ESTIMATION DEVICE, LIGHT-SOURCE DEVICE, IMAGE DISPLAY APPARATUS, OBJECT APPARATUS, WAVELENGTH ESTIMATION METHOD, AND LIGHT-SOURCE CONTROL METHOD

CROSS-REFERENCE TO RELATED APPLICATIONS

This patent application is based on and claims priority pursuant to 35 U.S.C. § 119(a) to Japanese Patent Application No. 2016-064030, filed on Mar. 28, 2016 and Japanese Patent Application No. 2016-174349, filed on Sep. 7, 2016 in the Japan Patent Office, the entire disclosures of which are hereby incorporated by reference herein.

BACKGROUND

Technical Field

Embodiments of the present disclosure relate to a wavelength estimation device, a light-source device, an image display apparatus, an object apparatus, a wavelength estimation method, and a light-source control method.

Related Art

A wavelength measurement method (for example, a method that employs a superheterodyne using an optical band-pass filter) for measuring a wavelength of light emitted from a light source is known.

Further, devices are known that combine light beams having different wavelengths emitted from a plurality of light sources and display a virtual image of the combined light beams.

To allow such devices to display a high-quality virtual image, an accurate measurement or estimation of the wavelength of light emitted from the light sources is needed.

SUMMARY

In an aspect of this disclosure, these is provided an unproved wavelength estimation device including a light detector to receive light emitted from a light source and an estimation unit. The estimation unit estimates a wavelength of the light based on an amount of light received by the light detector.

In another aspect of this disclosure, there is provided an improved light-source device including the above-described light source including a light-emitting element and the above-described wavelength estimation device to estimate the wavelength of the light emitted from the light-emitting element.

In still another aspect of tins disclosure, there is provided an improved image display apparatus including the above-described light-source device, an image forming element, and a screen irradiated with the light that has formed the image. The image forming element forms an image by light emitted from the light-source device.

In even still another aspect of this disclosure, there is provided an improved object apparatus including the above-described image display apparatus and an object mounted with the image display apparatus. The image display apparatus further includes a projector to project light having passed through the screen to a light-transmission window member.

In further still another aspect of this disclosure, there is provided an improved wavelength estimation method including receiving light emitted from a light source and estimating a wavelength of the light based on a light-reception result in the receiving.

Further described is a novel light-source control method including turning on a plurality of light sources having different light-emission wavelength bandwidths to emit light, receiving the light emitted from the plurality of light sources, estimating wavelengths of the light emitted from the plurality of light sources based on the light-reception result, and setting amounts of light emission of the plurality of light sources based on an estimation result in the estimating.

BRIEF DESCRIPTION OF THE DRAWINGS

The aforementioned and other aspects, features, and advantages of the present disclosure will be better understood by reference to the following detailed description when considered in connection with the accompanying drawings, wherein.

Figure 1:
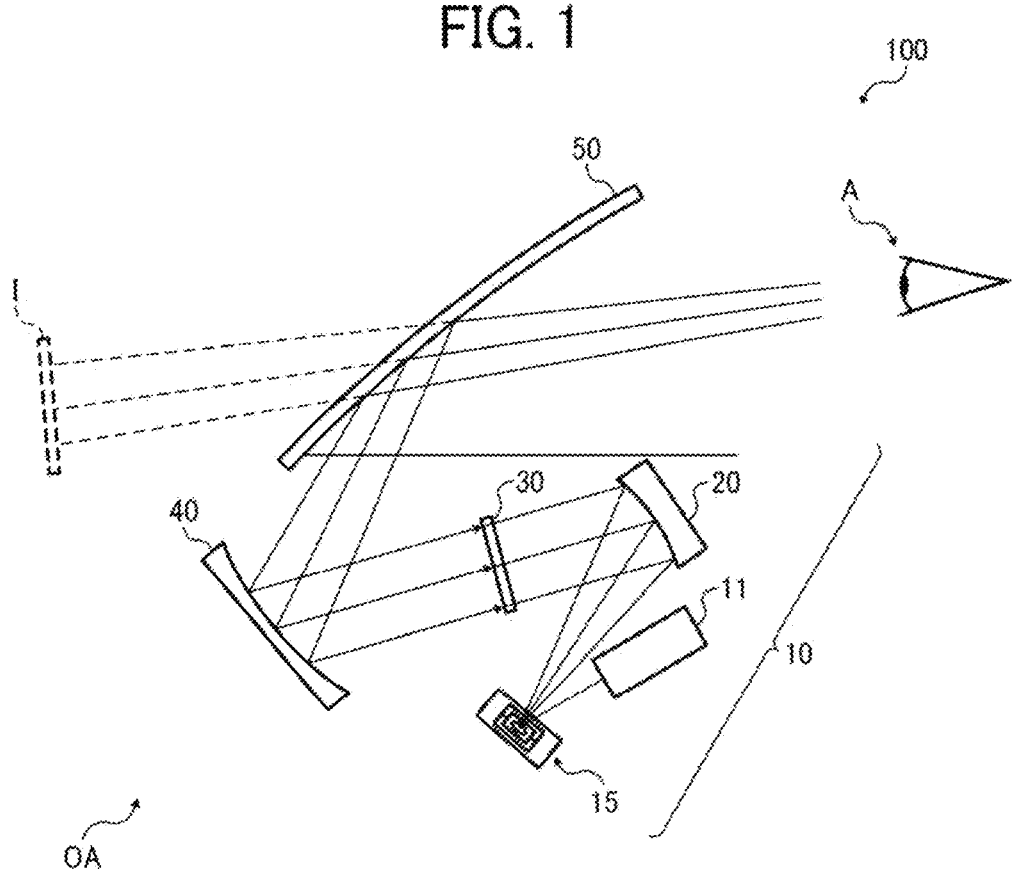
FIG. 1 is an illustration of a schematic configuration of a heads-up display (HUD) according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

A description is given of a heads-up display (HUD) 100 as an image display apparatus according to an embodiment of the present disclosure, referring to the Figures.

FIG. 1 is an illustration of a schematic configuration of the HUD 100 according to the present embodiment.

<Schematic Configuration of HUD>

As the HUD projection method, there is a panel system and a laser scanning system. In the panel system, an imaging device, such as a liquid crystal display (LCD), a digital micro-mirror device (DMD) panel (digital mirror device panel), or a vacuum fluorescent display (VFD) is used to form an intermediate image. In the laser scanning method, a two-dimensional scanning device scans with a laser beam emitted from a laser beam source to form an intermediate image. In particular, in the latter laser scan type, unlike the panel type where the image is formed by partial light blocking over the entire screen emission, since emitting or non-emitting can be assigned to each pixel on a pixel-by-pixel basis, in general, a high-contrast image can be formed.

In view of the above, the HUD according to the present embodiment adopts the laser scanning system. In some embodiments, the HUD according to the present embodiment may adopt the above-described panel system as the projection system.

The HUD 100 is mounted, for example, on a mobile object such as a vehicle, an aircraft, a ship, or a robot, and makes navigation information used for operating the mobile object (for example, speed of the mobile object, direction of travel of the mobile object, distance to a destination, name of current place, the presence and position of an object ahead of the mobile object, sign, such as speed limit, and traffic congestion information mileage) visible through a front window 50 (see FIG. 1) of the mobile object. In such a case, the front window 50 also serves as a transmission and reflection member that transmits a portion of the window light and reflects at least some of the remaining incident light. In the following description, cases in which the HUD 100 is mounted on a vehicle including the front window 50 are described.

As illustrated in FIG. 1, the HUD 100 includes an optical scanning device 10, a screen 30, and a concave mirror 40. The optical scanning device 10 includes a light-source unit 11, an optical deflector 15, and a scanning mirror 20 (for example, a concave mirror). The HUD 100 emits light (image light) for forming an image to the front window 50, to allow a viewer A (in the present embodiment, a driver of a vehicle) to visually identity a virtual image I at eye-level. In other words, the viewer A can visually identify, through the front window 50, an image (intermediate image) as the virtual image formed (drawn) on the screen 30 by the optical scanning device 10.

The HUD 100 is disposed under a dashboard of a vehicle as an example. The distance from the location of the eye of the viewer A to the front window 50 ranges from several tens of centimeters (cm) through approximately 1 meter (m).

In the present embodiment, the concave mirror 40 is designed by using a commercially available optical-designed simulation software such that the concave mirror 40 obtains a predetermined level of light-gathering power to achieve a desired image-forming position of the virtual image I.

In the HUD 100, the light-gathering power of the concave mirror 40 is designed such that the virtual image I is displayed at a position (in depth) with 1 m or more and 10 m or less (preferably 6 m or less) away from the eye of the viewer A.

The front window 50 typically has a slightly curved surface, and is not a flat plane. The curved surfaces of the concave mirror 40 and the front window 50 determine the image-forming position of the virtual image I.

The light-source unit 11 combines laser beams of three colors R (red), G (green), and B (blue) modulated according to image data. A part of the combined light, in which the three-color laser beams are combined, is guided to the reflection plane of the optical deflector 15. The optical deflector 15 is a micro-electromechanical system (MEMS) scanner produced by a semiconductor manufacturing process. The optical deflector 15 includes a single micro-mirror that is independently rotatable about two perpendicular axes. In some embodiments, the optical deflector 15 may be a combination of two MEMS scanners each with a micro-mirror that is rotatable about one axis. Examples of a scanner may include, but is not limited to, the MEMS scanner, a galvano scanner, and a polygon scanner. The light-source unit 11 and the optical deflector 15 will be described later in detail. The light (a part of the above-described combined light) according to image data from the light-source unit 11 is deflected by the light deflector 15 and reflected by the scanning mirror 20 with the divergence of the light reduced by the scanning mirror 20. Thus, the light goes to the screen 30. Then, the screen 30 is optically scanned to form an intermediate image thereon. In that case, it is desired that the concave mirror 40 be designed and disposed so that the concave mirror 40 corrects the optical deformation in which the horizontal line of the intermediate image is distorted to be convex upward or downward due to the effect of the front window 50.

The light having passed through the screen 30 is reflected by the concave mirror 40 toward the front window 50. Some of light rays that enter the front window 50 permeate the front window 50, and at least some of the remaining light rays are reflected by the front window 50 toward the viewpoint position (the eye) of a viewer A. As a result, the viewer A can visually identify, through the 50, a virtual image I that is an enlarged intermediate image. In other words, the viewer A identifies the enlarged and displayed virtual image I through the from window 50.

In some embodiments, a combiner as the transmission and reflection member may be disposed closer to the viewpoint position of the viewer A than the front window 50 to receive light from the concave mirror 40, which allows displaying a virtual image in the same manner as in the configuration with only the front window 50 disposed.

<Hardware Configuration of Control System of the HUD>

Figure 2:
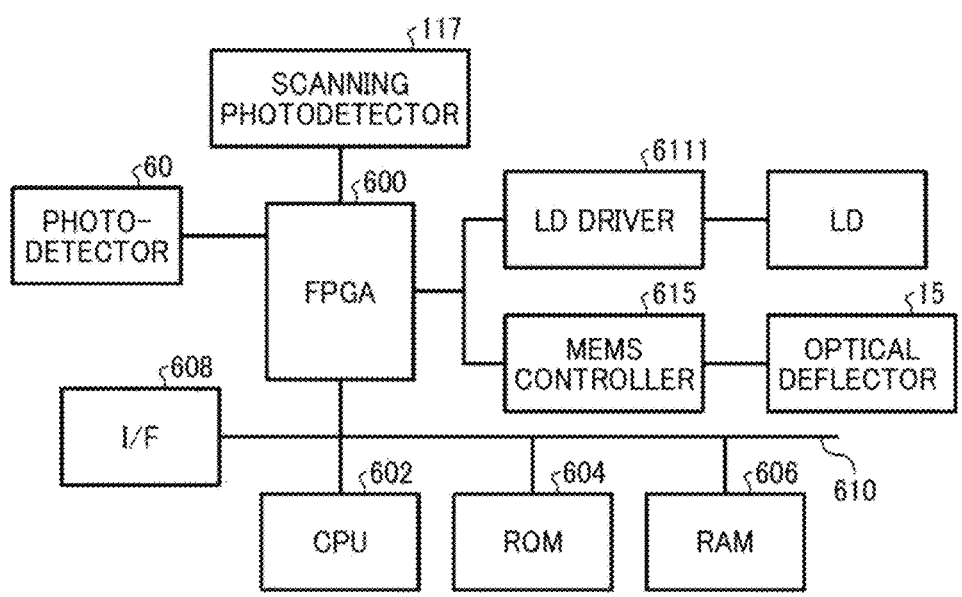
FIG. 2 is a block diagram of a hardware configuration of a control system of the HUD.

FIG. 2 is a block diagram of a hardware configuration of the HUD 100. As illustrated in FIG. 2, the HUD 100 includes an field programmable gate array (FPGA) 600, a central processing unit (CPU) 602, a read-only memory (ROM) 604, a random access memory (RAM) 606, an interlace (IF) 608, a bus line 610, a laser diode (LD) driver 6111, and a micro-electromechanical systems (MEMS) controller 615.

The FPGA 600 includes an LD control circuit 700 (shown in FIG. 6) and an optical deflector control circuit. The LD control circuit 700 controls, through the LD driver 6111, an LD to be described later based on image data, an output of a light detector 117 to be described later or a signal processing unit 120 (signal processor), and an output of a scanning photodetector 60. The optical deflector control circuit controls an optical deflector 15 through the MEMS controller 615. The CPU 602 controls operation of the HUD 100. The ROM 604 stores an image processing program that is executed by the CPU 602 to control operation of the HUD 100. The RAM 606 is used as a working area in which the CPU 602 executes the program. The IF 608 is an interface to communicate with an external controller such as a controller area network (CAN) of a vehicle.

<Functional Blocks of the HUD>

Figure 3:
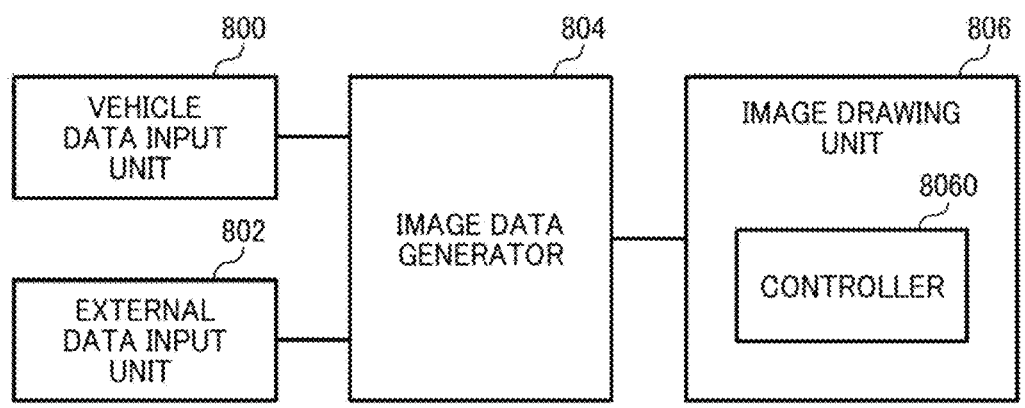
FIG. 3 is a functional block diagram of the HUD according to an embodiment of the present disclosure.

FIG. 3 is a block diagram of the HUD 100. As illustrated in FIG. 3, the HUD 100 includes a vehicle data input unit 800, an external data input unit 802, an image data generator 804, and an imaging unit 806. The vehicle data input unit 800 receives vehicle-related data, such as the speed and mileage of the vehicle, the distance to a target, and the brightness of outside, from the CAN. The external data input unit 802 receives external data, such as navigation information from the global positioning system (GPS), from the external network. The image data generator 804 generates image data of an image to be drawn according to the data input from the vehicle data input unit 800 and the external data input unit 802, and sends the generated image data to a field programmable gate array (FPGA) 600. The imaging unit 806 includes a controller 8060 to send a control signal to control the FPGA 600 to start or end drawing an image.

<Configuration of Optical Deflector>

Figure 4:
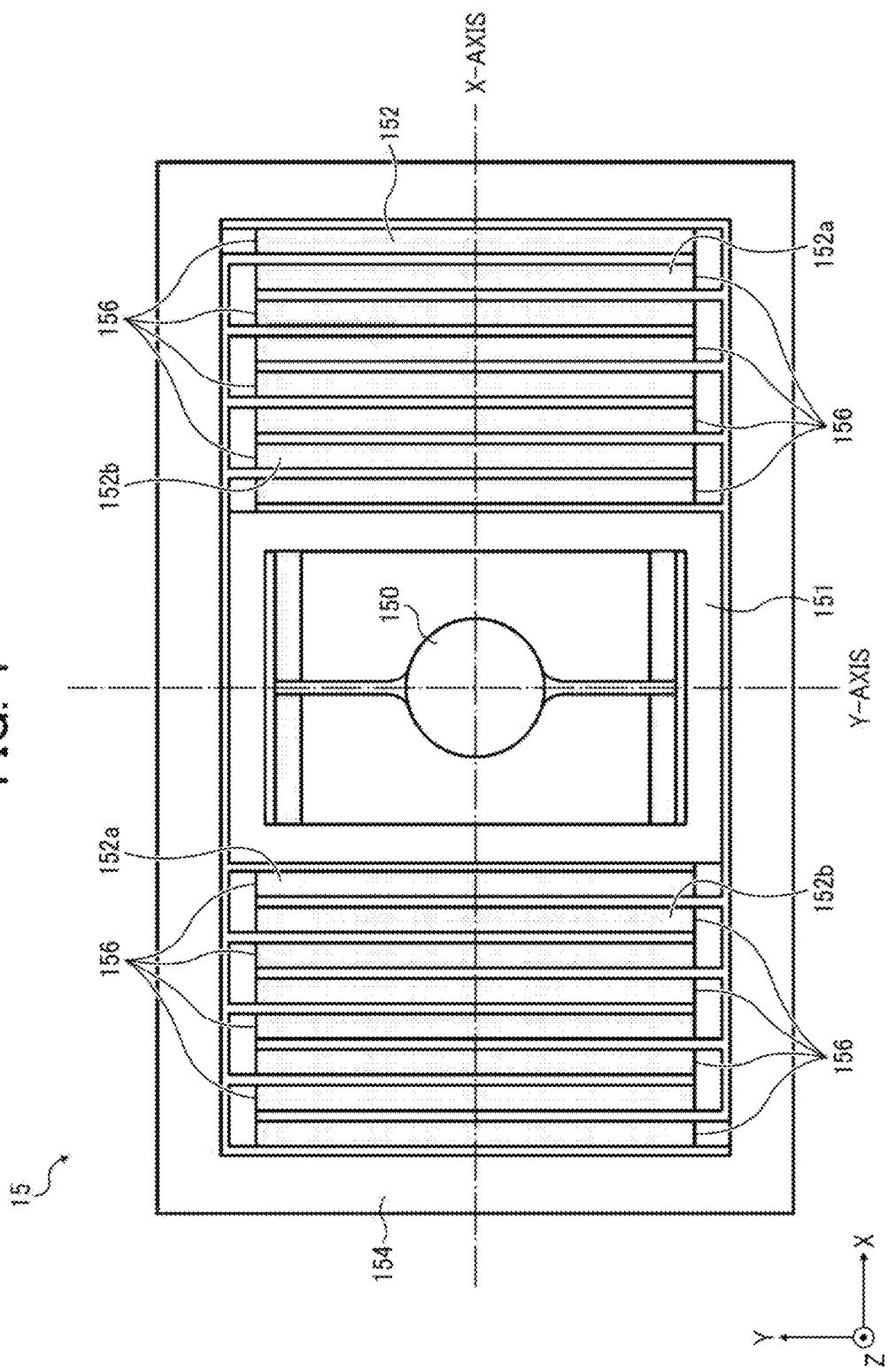
FIG. 4 is an illustration of an optical deflector of the HUD according to an embodiment of the present disclosure.

FIG. 4 is an illustration of a configuration of the deflector 15. As illustrated in FIG. 4, the optical deflector 15, which is a MEMS scanner produced by a semiconductor manufacturing process, includes a mirror 150 having a reflection plane and a plurality of bars arranged in an X-axis direction. The optical deflector 15 further includes a pair of serpentine units 152 in which two neighboring beams are connected to form a meander geometry. The two neighboring beams of each serpentine unit 152 are a first beam 152a and a second beam 152b supported by a frame member 154. Each of the first beam 152a and the second beam 152b is provided with a plurality of piezoelectric materials 156 (for example, PZT (lead zirconate titanate)). Different voltages are applied to the piezoelectric member of the two neighboring beams 152a and 152b in each serpentine unit 152. Accordingly, two adjacent beams 152a and 152b bend in different directions. As elastic energy is accumulated in the bent portion, the mirror 150 rotates about the X axis (in the vertical direction) with a wide angle. Due to such a configuration, optical scanning where the vertical axis is the center of the X axis can be performed in the vertical direction with lower voltage. On the other hand, around the Y axis in the horizontal direction, the optical scanning with resonance is performed using, for example, a torsion bar that is connected to the mirror 150.

Figure 5:
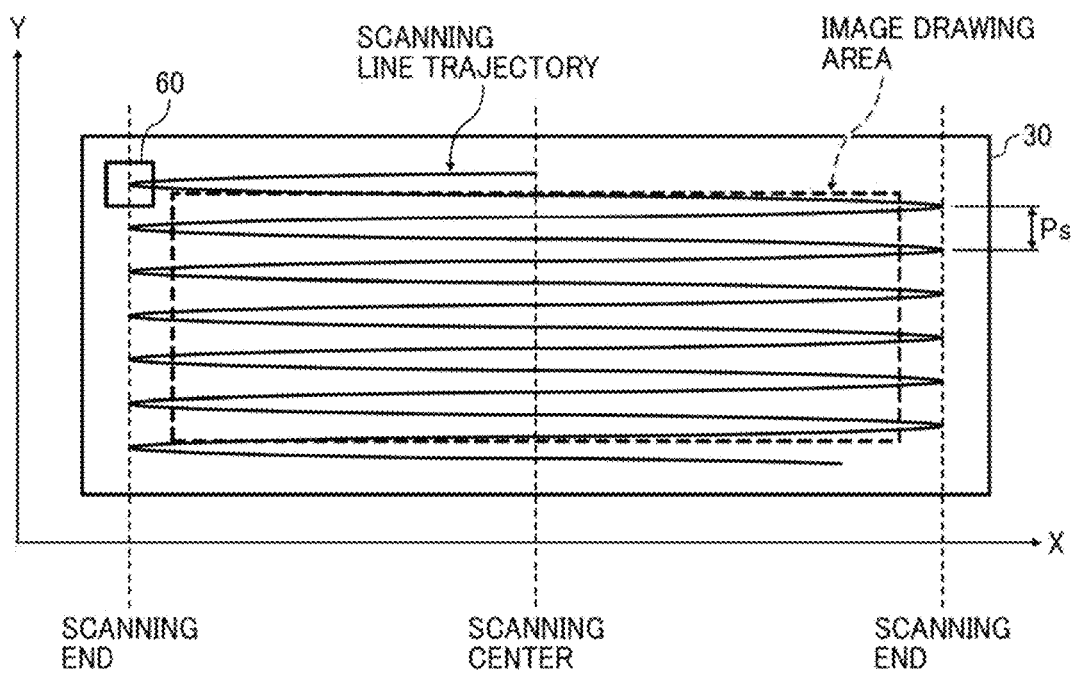
FIG. 5 is a diagram of an example of a trajectory of a scanning line when two-dimensional scanning is performed, according to an embodiment of the present disclosure.

The above-described configuration of the optical defector 15 allows a laser beam to two-dimensionally scan an imaging area of the screen 30 (for example, by raster scanning) (see FIG. 5) and allows drawing an image and displaying a virtual image for each pixel by controlling the light emission of the LD according to the scanning position of the laser beam. In FIG. 5, Ps is a scanning line pitch.

<Optical Scanning and Virtual Image Displays>

Although the HUD 100 momentarily projects a dot image corresponding to a laser beam diameter, an afterimage within one frame image sufficiently remains in the human eye because of very-high-speed scanning. Such an afterimage phenomenon allows a driver to perceive the afterimage as an image projected onto an "image display area". In actuality, the image having been displayed on the screen 30 is reflected by the concave mirror 40 and the front window 50 and the image is perceived as a virtual image by a driver in the image display area. In such a mechanism, the light emission of the LD may be stopped when no image is displayed. In other words, the brightness can be substantially set to zero for any place other than the place in which a virtual image is displayed in the image display area.

More specifically, the image-forming position of a virtual image formed by the HUD 100 is any position within the image display area in which the virtual image can be formed. Such an image display area is determined according to the design specifications for the HUD. As described above, the laser scanning system is adopted in the present embodiment. This allows switching off the LD or reducing the amount of light of the LD for portions not to be displayed (hidden).

In the panel system, in which an intermediate image is expressed by the imaging device, such as a liquid crystal display (LCD) and a digital micro-mirror device (DMD), completely hiding the images is difficult even in a black display mode due to the properties of the LCD and the DMD in which the entire panel is illuminated. This causes misadjusted black level. However, the laser scanning system can prevent such a misadjusted black level (black floating).

As illustrated in FIG. 5, the scanning photodetector 60 is disposed in a peripheral area of an imaging area ("effective scanning area") in the screen 30. The scanning photodetector 60 detects the motion of the optical deflector 15. Specifically, the scanning photodetector 60 detects the scanning timing (the scanning position of a laser beam) in response to light radiated onto a signal area, and controls a change in property of the optical deflector with changes in environment and changes over time, thus maintaining a constant image quality. The scanning photodetector 60 according to the present embodiment includes a photodiode or a phototransistor. The scanning photodetector 60 outputs a signal (output signal) to the FPGA 600.

<Light-Source Unit>

Figure 6:
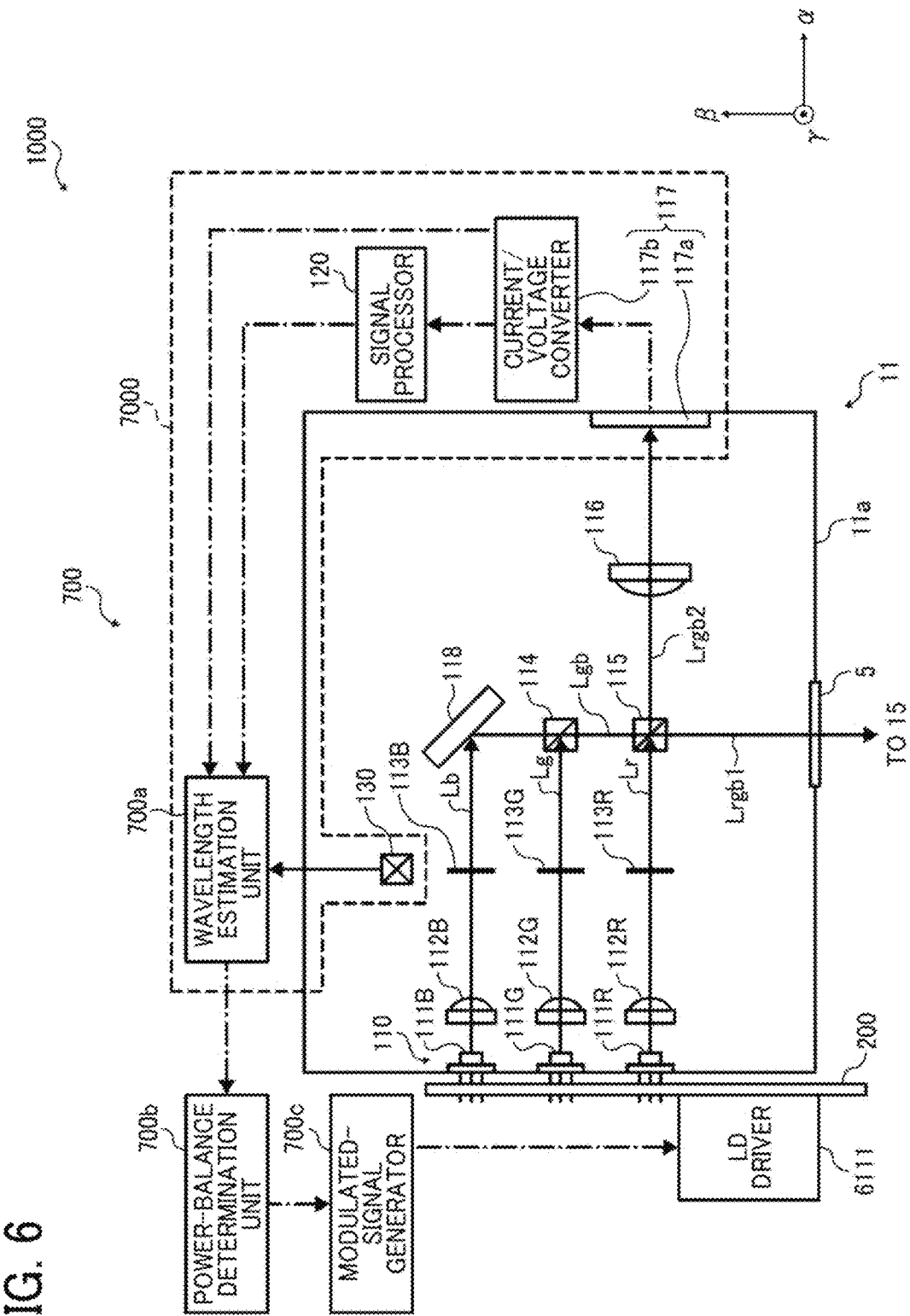
FIG. 6 is an illustration of a light-source device of the HUD according to an embodiment of the present disclosure.

The following describes the light-source unit 11 in detail. FIG. 6 is an illustration of a schematic configuration of the light-source unit 11. In the following description, an αβγ three-dimensional rectangular coordinate system as illustrated, for example, FIG. 6, is referred to where appropriate.

As illustrated in FIG. 6 for example, the light-source unit 11 includes a plurality of light sources (for example, three light sources in the present embodiment) each including a light emitting element 111 and a package that contains the light emitting element 111. The light-emitting element has a single or a plurality of light-emitting points. The light-emitting elements of the three light sources are referred to as a light-enduing element 111R, a light-emitting element 111B, and a light-emitting element 111G, which are referred to collectively as a light-emitting element 111.

The light-source unit 11 includes, in addition to the three light sources 110 (the light-emitting elements 111R, 111B, and 111G), a plurality of (for example, three) coupling lenses 112R, 112G, and 112B, a plurality of (for example, three) aperture members 113R, 113G, and 113B, two optical-path combining elements 114 and 115, a condenser lens 116, a light detector 117, and a reflection mirror 118. Each constituent element of the light-source unit 11 is incorporated in a housing 11a.

Each light-emitting element 111 is an end-surface light-emitting semiconductor laser (LD) having a different oscillation wavelength bandwidth (light-emission wavelength bandwidth). When the oscillation wavelengths (design values) of the light-emitting elements 111R, 111G, and 111B are $\lambda R$, $\lambda G$, and $\lambda B$, respectively, $\lambda R$ is 653 nm, $\lambda G$ is 515 nm, and $\lambda B$ is 453 nm. In the present embodiment, each of the light-emitting elements 111R, 111G, and 111B emits light in a $+\alpha$ direction (direction of light emission). Each of the light-emitting elements 111R, 111G, and 111B is mounted on a circuit board 200 provided with the LD driver 6111. Hereinafter, each of the light-emitting elements 111R, 111G, and 111B is referred to also as a "semiconductor laser" or "LD".

Laser beams Lr, Lg, and Lb emitted from the LD 111R, 111G, and 111B pass through the respective coupling lenses 112R, 112G, and 112B to be coupled to a subsequent optical system.

The coupled laser beams Lr, Lg, and Lb are shaped by the respective aperture member 113R, 113G, and 113B. The aperture members may have various kinds of shapes, such as a circle, an ellipse, a rectangle, and a square, according to the divergence angle of a laser-beam bundle.

The laser-beam bundle Lb having passed through the aperture member 113B is reflected by the reflecting mirror 118 toward a $-\beta$ direction and enters the optical-path combining element 114 (for example, a dichroic mirror).

The laser-beam bundle Lg having passed through the aperture member 113G enters the optical-path combining element 114 (for example, a dichroic mirror) to be combined with the laser-beam bundle Lb. More specifically, the laser-beam bundle Lb having passed through the reflection mirror 118 permeates through the center of the optical-path combining element 114 in the $-\beta$ direction. The laser-beam bundle Lg having passed through the aperture member 113G is reflected by the center portion of the optical-path combining element 114 toward the $-\beta$ direction.

The combined laser-beam bundle Lgb, in which the laser-beam bundle Lg is combined with the laser-beam bundle Lb, is combined with the laser-beam bundle Lr having passed through the aperture member 113R at the optical-path combining element 115. Then, the laser-beam bundle combined at the optical-path combining element 115 separates into a transmitted light beam and a reflected light beam. In the present embodiment, the two optical-path combining elements 114 and 115 and the reflecting mirror 118 are separate elements. In some embodiments, at least two optical-path combining elements 114 and 115 may be constituted as a single unit.

More specifically, a part of the combined laser-beam bundle Lgb is transmitted through the center portion of the optical-path combining element 115 toward the $-\beta$ direction, and the remaining part of the combined laser-beam bundle Lgb is reflected by the center portion of the optical-path combining element 115 toward the $+\alpha$ direction. A part of the laser-beam bundle Lr having passed through the aperture member 113R is reflected by the center portion of the optical-path combining element 115 toward the $-\beta$ direction, and the remaining part of the laser-beam bundle Lr is transmitted through the center portion of the optical-path combining element 115 toward the $+\alpha$ direction.

In other words, a combined laser-beam bundle Lrgb1, in which the part of the combined laser-beam bundle Lgb is combined with the part of the laser-beam bundle Lr, is emitted toward the $-\beta$ direction, and a combined laser-beam bundle Lrgb2, in which the remaining part of the combined laser-beam bundle Lgb is combined with the remaining part of the laser-beam bundle Lr, is emitted toward the $+\alpha$ direction.

The housing 11a includes a light-transmission window 5 to surround and cover an opening in the housing 11a. The combined laser-beam bundle Lrgb1 is emitted toward the optical deflector 15 through the light-transmission window member 5, and is used for drawing an image (displaying a virtual image) on the screen 30. Note that a meniscus lens having a concave surface toward the side of the optical deflector 15 may be disposed between the optical-path combining element 115 and the optical deflector 15.

The combined laser-beam bundle Lrgb2 is guided to the light detector 117 through the condenser lens 116. The light detector 117 outputs a signal according to the amount of the combined laser-beam bundle Lrgb2 having been received by the light detector 117, to the LD control circuit 700. The light detector 117 includes a light-receiving element 117a and a current-voltage converter 117b to convert the output current of the light-receiving element 117a into a voltage signal (received-light signal). As the light-receiving element 117a, a photodiode (PD) or a phototransistor may be used.

The signal processing unit 120 is disposed downstream of the current-voltage converter 117b to temporally average the received-light signal. The signal processing unit 120 adds up the received-light signals that have been input during a predetermined time period T, and temporally averages (divides by T) the sum, outputting the averaged value to the LD control circuit 700. Note that in some embodiments, the signal processing unit 120 may directly output the received-light signal sent from the current-voltage converter 117b to the LD control circuit 700.

As is apparent from FIG. 6, the optical path length between each light-emitting element 111 and the optical-path combining element 115 is different for each light-emitting element. More specifically, the optical-path length between the light-emitting element 111B and the optical-path combining element 115 is the longest, and the optical-path length between the light-emitting element 111R and the optical-path combining element 115 is the shortest. This is because a great amount of red light and a small amount of blue light are used to form a white color in a virtual image where a ratio of combination of RGB (red, green, and blue) is approximately 2.5:1:0.5. This configuration prevents a reduction in utilization efficiency of light of the light-emitting elements.

The LD control circuit 700 generates a modulating signal (a pulse signal) for each light-emitting element based on the output signal of the light detector 117, and sends the modulating signal to the LD driver 6111. The LD driver 6111 applies a drive current according to the modulating signal for each light-emitting element to each light-emitting element.

Note that the light-source unit 11 preferably generates light of a desired color to allow the HUD 100 to display a virtual image of the desired color.

That is, an appropriate power balance is preferably set between light rays (emitted light) emitted from the semiconductor lasers (the light-emitting elements 111R, 111G, and 111B) having oscillation wavelengths λR, λG, and λB, respectively to be combined.

For this reason, the ratio between the amounts of light emission of the light-emitting elements 111R, 111G, and 111B (a:b:c) is preferably in proportion to the oscillation wavelengths λR, λG, and λB to generate light of a desired color. This can theoretically generate light of a desired color.

However, the oscillation wavelength of the semiconductor laser actually varies with the amount of light emission that increases or decreases according to the ambient temperature around the semiconductor laser and the amount of current (drive current) applied to the semiconductor laser. Accordingly, the generation of light of a desired color might result in failure. Particularly, the HUD has a great dynamic range in variations of light and shade in the surrounding environment of a vehicle. This increases the changes in amount of light emission to respond to such a great dynamic range and changes the ambient temperature according to the time and the position of a vehicle, thus changing the oscillation wavelength. That is, the oscillation wavelength disadvantageously differs from the design value. This means that the oscillation wavelength bandwidth also differs from the design value.

To display a virtual image of a desired color, the wavelength of light emitted from each semiconductor laser is preferably monitored in a timely manner, and the amount of light emission of each semiconductor laser is appropriately adjusted based on the monitored wavelength in the HUD 100.

A superheterodyne that uses a light band-pass filter is known as a method for measuring a wavelength. However, using the superheterodyne method increases the size of the HUD, which is disadvantage from the viewpoint of responding to the demand for reducing the size because of the constraint of the installation space of the HUD in a vehicle.

To handle such a circumstance, the present inventors have paid attention to the fact that the temperature dependence of the oscillation wavelength is linear irrespective of the type of semiconductor laser and have found that using this property of the oscillation wavelength can enable accurate estimation of the wavelength of light emitted from the semiconductor laser.

Figure 7:
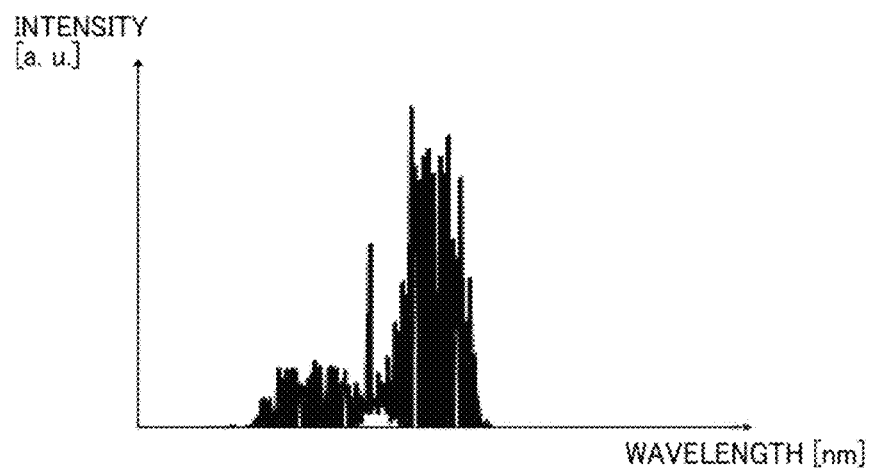
FIG. 7 is a spectrum distribution map of a high-power semiconductor laser that oscillates in a multi-longitudinal mode.

A description is given of a wavelength (an estimation target wavelength) to be estimated by a wavelength estimation unit 700a as an estimation unit. FIG. 7 is a spectrum distribution map of a high-power semiconductor laser that oscillates in a multi-longitudinal mode.

As can be understood from FIG. 7, it is extremely difficult to determine the wavelength (the estimation target wavelength) of light emitted from a semiconductor laser having such a spectrum distribution in the oscillation wavelength bandwidth as described in FIG. 7, unlike the semiconductor laser that oscillates in a single-longitudinal mode.

However, the present inventors have found that power balance very strongly correlates with color generation based on the estimation target wavelength in generating color for a virtual image in the HUD. In this case, the estimation target wavelength is defined as a wavelength obtained by weighted-averaging wavelength components having intensities ranging from Id to a value of −20 decibel (dB) relative to Id in the multi-longitudinal mode, where Id is the value of the peak intensity. With wavelength components having intensities less than the intensity of −20 dB relative to the peak intensity (Id), errors in color generation can be ignored. With the weighted-average wavelength, measuring wavelength is easy because there is no need to obtain the chromatic coordinate of a semiconductor laser same as in the dominant wavelength that is adopted in light-emitting diodes (LEDs).

By contrast, in the semiconductor laser that oscillates in the single-longitudinal mode, a single-spectrum wavelength itself is a target wavelength for estimation (estimation target wavelength).

The following describes the temperature dependence of the oscillation wavelength (the temperature dependence of light emitted from the semiconductor laser) in detail.

Figure 8:
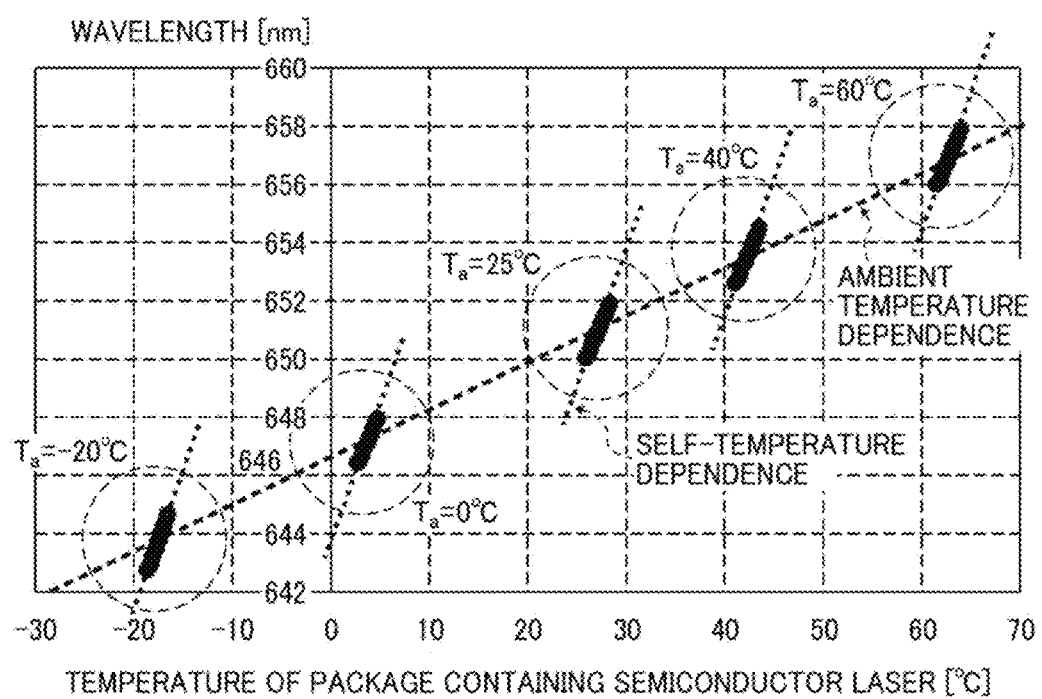
FIG. 8 is a graph of self-temperature dependence and ambient temperature dependence of wavelengths of light emitted from a semiconductor laser for red color.
Figure 9:
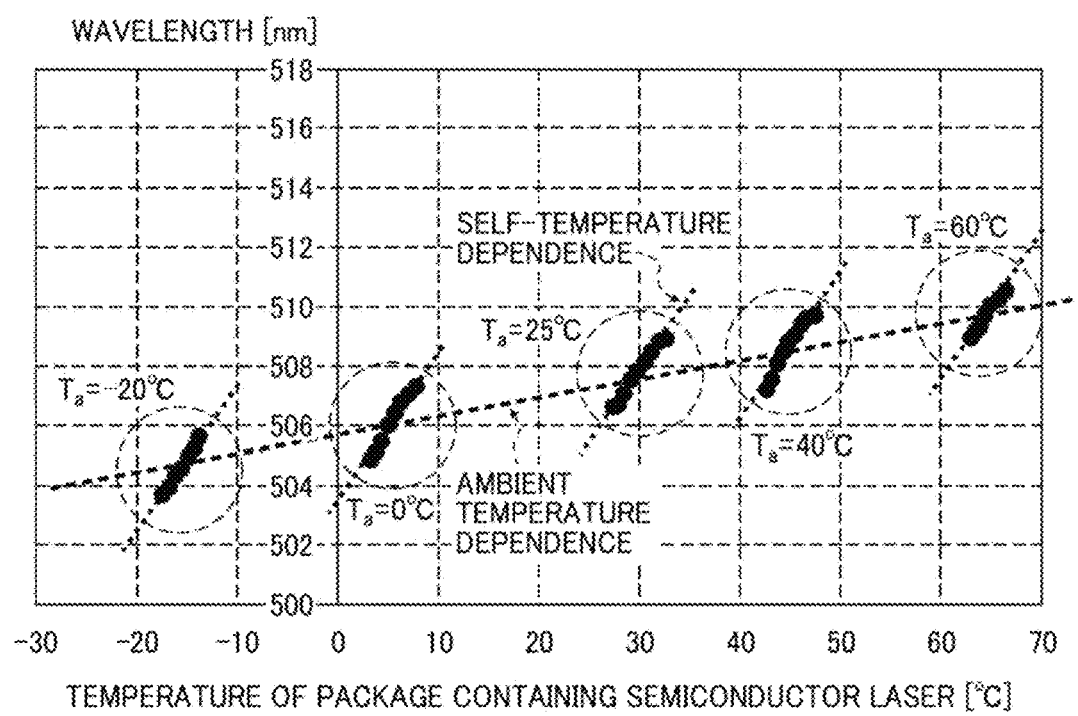
FIG. 9 is a graph of self-temperature dependence and ambient temperature dependence of wavelengths of light emitted from a semiconductor laser for green color.

FIG. 8 is an illustration of the relations between the actual measured values of an oscillation wavelength and the temperatures of a package containing a semiconductor laser with the oscillation wavelength of the design value of 653 nm (red color). FIG. 9 is an illustration of the relations between the actual measured values of an oscillation wavelength and the temperatures of a package containing a semiconductor laser with the oscillation wavelength of the design value of 515 nm (green color) FIG. 10 is an illustration of the relations between the actual measured values of an oscillation wavelength and the temperatures of a package containing a semiconductor laser with the oscillation wavelength of the design value of 453 nm (blue color).

Figure 10:
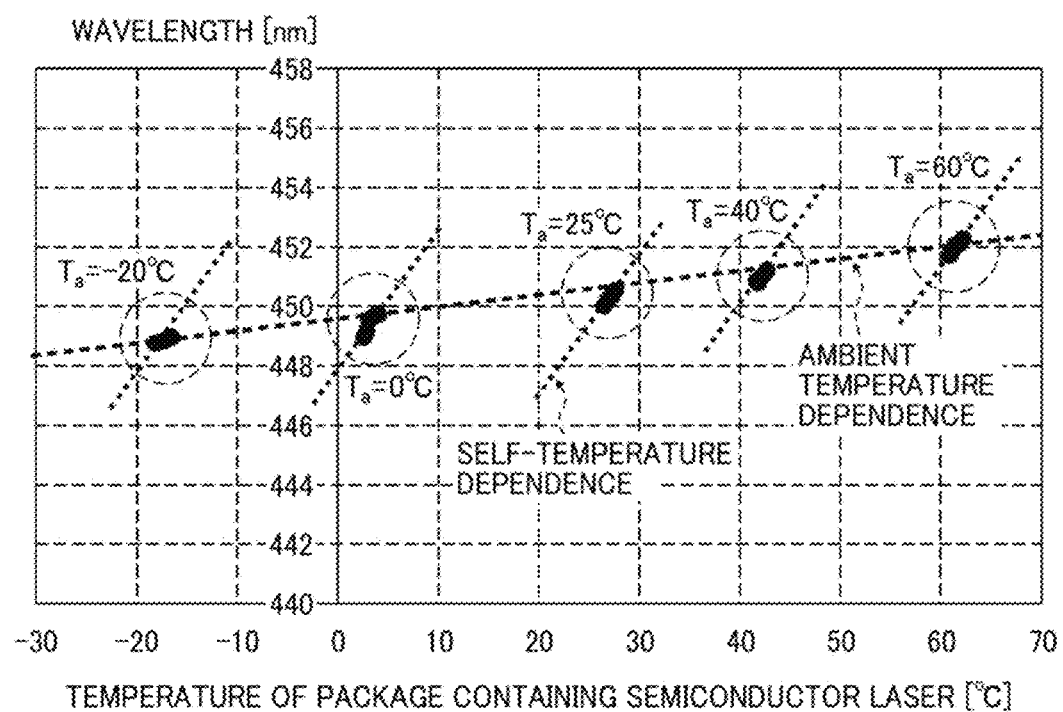
FIG. 10 is a graph of self-temperature dependence and ambient temperature dependence of wavelengths of light emitted from a semiconductor laser for blue color.

It can be found from FIGS. 8 through 10 that the temperature dependence of oscillation wavelength has two types irrespective of the types of a semiconductor laser. The two types are (1) the ambient temperature dependence that is a dependence on the ambient temperature of the semiconductor laser and (2) the self-temperature dependence that is a dependence on self-heating according to the amount of self-light emission.

These two types of temperature dependence are preferably used to accurately estimate the wavelength of light emitted from the semiconductor laser.

In the present embodiment, a temperature sensor 130 (see FIG. 6 for example) is used to monitor the ambient temperature of a semiconductor laser, and the light detector 117 is used to monitor the amount of light emission of the semiconductor laser. Thus, the wavelength of light emitted from each semiconductor is estimated based on both of the ambient temperature dependence and the self-temperature dependence. The details will be described later.

Referring back to FIG. 6, the LD control circuit 700 includes the wavelength estimation unit 700a, a power-balance determining unit 700b as light-emission-amount setting unit and a modulated-signal generator 700c.

The wavelength estimation unit 700a estimates the wavelength of light emitted from each semiconductor based on a signal output from (the output signal of) the light detector 117 and the output of the temperature sensor 130 or a detector to be described below. That is, the wavelength estimation unit 700a, the light detector 117, and the temperature sensor 130 (or the detector) constitutes a wavelength estimation device 7000.

More specifically, the wavelength estimation unit 700a monitors the amount $P_{moni}$ of light reception at the light-receiving element 117a (the output signal of the light), and calculates light utilization efficiency η between the semiconductor laser and the light-receiving element 117a relative to the amount $P_{moni}$ of light reception, thus converting the calculated light utilization efficiency η into the current amount P of light emission of the semiconductor laser. In other words, P is obtained by dividing $P_{moni}$ by η.

As a method for oscillating the semiconductor laser, various pulse oscillation modes can be considered depending on information to be generated as a virtual image of the HUD. The present inventors have found that the wavelength can be accurately estimated when the amount P of light emission is defined as "time-averaged amount of light emission".

In the present embodiment, the temperature sensor 130 is preferably disposed at a position that allows for obtaining the ambient temperature of the semiconductor because the wavelength of light emitted from the semiconductor has the ambient temperature dependence as described above.

In some embodiments, a different temperature sensor (hereinafter, referred to as a "package temperature sensor") may monitor a package temperature $T_{pk}$, which is the temperature of the package 11b containing the semiconductor laser, instead of detecting the ambient temperature by the temperature sensor 130. The package temperature sensor may be a contact type or a non-contact type. When $T_{pk}$ is the package temperature, $T_a$ is the ambient temperature, and $T_{LD}$ is the temperature of the semiconductor laser (hereinafter referred to also as the semiconductor laser temperature), the relation of $T_{pk}=T_a+T_{LD}$ is satisfied. Thus, the package temperature $T_{pk}$ is obtained by adding the semiconductor laser temperature $T_{LD}$ to the ambient temperature $T_a$.

In this case, the semiconductor laser temperature $T_{LD}$ depends on the ratio of the time period of pulse oscillation relative to the cycle of the pulse oscillation, i.e., a duty ratio.

Accordingly, the semiconductor laser temperature $T_{LD}$ according to the duty ratio of a semiconductor laser is preliminarily written for each color in the firmware of the wavelength estimation unit 700a. The semiconductor laser temperature $T_{LD}$ is read out from the firmware based on the pulse oscillation information (the duty ratio of the semiconductor laser for each color) when the package temperature $T_{pk}$ is obtained. Then, the ambient temperature $T_a$ is obtained by subtracting the semiconductor laser temperature $T_{LD}$ from the package temperature $T_{pk}$. In this case, the ambient temperature $T_a$ is not needed to be obtained by subtracting the semiconductor laser temperature $T_{LD}$ from the package temperature $T_{pk}$ for all of the semiconductor lasers. Instead, the ambient temperature $T_a$ may be obtained by the above-described calculation for at least one of the semiconductor lasers. However, errors in $T_{pk}-T_{LD}$ might occur between semiconductor lasers. Accordingly, it is preferable that $T_a$ is obtained by $T_{pk}-T_{LD}$ for a plurality of semiconductor lasers, and the average value or the center value of the obtained values of $T_a$ is adopted.

With the semiconductor laser switched off (i.e., the duty ratio is 0%), the semiconductor laser temperature $T_{LD}$ is the lowest. With the semiconductor laser that has continuously emitted light (the duty ratio is 100%), the semiconductor laser temperature $T_{LD}$ is the highest. The changes in semiconductor laser temperature with the duty ratio are assumed to have linearity.

In the present embodiment the temperature $T_{LD}$ of the semiconductor laser that is switched off and the temperature $T_{LD}$ of the semiconductor that has continuously emitted light is written for each color in the firmware, and the semiconductor laser temperature $T_{LD}$ when the package temperature $T_{pk}$ is measured may be obtained based on the duty ratio. In this case as well, the semiconductor laser temperature $T_{LD}$ may be obtained for at least one semiconductor laser for the same reason as described above.

Further, the semiconductor laser temperature $T_{LD}$ is typically 0° C. with the semiconductor laser switched off (the duty ratio is 0%). In view of this, only the temperature $T_{LD}$ of the semiconductor laser that has continuously emitted light is preliminarily written in the firmware of the wavelength estimation unit 700a. Then, the semiconductor laser temperature $T_{LD}$ when the package temperature $T_{pk}$ is measured may be calculated based on the duty ratio, using the temperature $T_{LD}$ of the switched-off semiconductor laser of 0° C. In this case as well, the semiconductor laser temperature $T_{LD}$ may be obtained for at least one semiconductor laser for the same reason as described above.

The above-described detection of the ambient temperature $T_a$ by monitoring the package temperature $T_{pk}$ is performed by the detector including the package temperature sensor, a duty-ratio acquisition unit to acquire the duty ratio of the semiconductor laser, the above-described firmware, and a calculator to calculate the expression of $T_{pk}-T_{LD}$.

Preferably, the wiring length between the LD driver 6111 and the semiconductor laser is relatively short to speed up the pulse oscillation of the semiconductor laser. This, however, might cause the heat generated by the drive of the LD driver 6111 to propagate to a ground layer of the circuit board 200, thus further increasing the temperature $T_{LD}$ of the semiconductor laser. In this case, the temperature $T_{pk}$ of a package 11b that contains the semiconductor laser is a temperature in which the temperature components of the ambient temperature $T_a$, the semiconductor laser temperature $T_{LD}$, and the temperature $T_{IC}$ of the LD driver 6111 are combined. That is, the package temperature $T_{pk}$ is obtained by adding the ambient temperature $T_a$, the semiconductor laser temperature $T_{LD}$, and the temperature $T_{IC}$ of the LD driver 6111 together ($T_{pk}=T_a+T_{LD}+T_{IC}$).

When the LD driver 6111 is shared among the semiconductor lasers for the respective colors, the LD driver 6111 preferably drives, for example, only the semiconductor laser for the red color to emit light and maintains the other semiconductor lasers for the remaining colors switched off. That is, when the LD driver 6111 is common between the semiconductor lasers, any cases other than the effect on the duty ratios are preferably considered. Further, the effects of the temperature $T_{IC}$ of the LD driver 6111 are preferably considered for a method for extracting the ambient temperature $T_a$ from the temperature $T_{pk}$ of the package 11b that contains a semiconductor laser.

In the present embodiment, the temperature sensor 130 is disposed near the aperture member 113B that is separated from each semiconductor laser in the housing 11a as an example. In some embodiments, the temperature sensor 130 may be disposed near another aperture member (113G or 113R), the reflection mirror 118, the optical-path combining element (114 or 115), or the condenser lens 116. In any case, the temperature sensor 130 is preferably disposed at a position within an appropriate distance from each semiconductor laser to detect the ambient temperature of the semiconductor laser.

The temperature sensor 130 may be capable of detecting the ambient temperature of a light-emitting element, and examples of the temperature sensor 130 include a thermocouple, a thermistor, a resistance temperature detector, and a radiation thermometer.

The wavelength estimation unit 700a also monitors the ambient temperature detected by the temperature sensor 130 or above-described detector, in addition to monitoring the amount of light received by the light-receiving element 117a to estimate the current wavelength of light emitted from a semiconductor laser.

In such a case, the current wavelength λ of light emitted from a semiconductor laser can be expressed by formula (1) below, where $\lambda^{(0)}$ is the reference wavelength, α is the ambient temperature coefficient, $T_a$ is the current ambient temperature, $T_a^{(0)}$ is the ambient temperature when the reference wavelength is measured, β is the light-amount coefficient, P is the current amount of light emission, $P^{(0)}$ is the amount of light emission when the reference wavelength is measured.

$$\lambda = \lambda^{(0)} + \alpha \times (T_a - T_a^{(0)}) + \beta \times (P - P^{(0)}) \quad (1).$$

Note that the temperature coefficient α in FIGS. 8 through 10 is the slope of the graph of the ambient temperature dependence, and the light-amount coefficient β in FIGS. 8 through 10 is the slope of the graph of the self-temperature dependence.

The reference wavelength $\lambda^{(0)}$ is preferably the above-described weighted-average wavelength. In this case, the current wavelength λ is substantially the weighted-average wavelength as well.

Using the above-described formula (1) allows accurately estimating the current wavelength λ even with any values of the current ambient temperature and the current amount of light emission.

When the conditions for the pulse oscillation of the light-emitting element are constant, the reference wavelength $\lambda^{(0)}$ may be obtained under "a certain condition" for any desired ambient temperature $T_a^{(0)}$ and any desired amount of light emission $P^{(0)}$. However, it is unlikely in general that the pulse oscillation is performed under one single condition because various types of information are generated as a virtual image of the HUD and the brightness of the virtual image of the HUD 100 is changed with the brightness outside the vehicle.

In this case, the reference wavelength $\lambda^{(0)}$ is preferably defined as a virtual wavelength with an amount of light emission $P^{(0)}$ of 0 watt (W). The amount of light emission $P^{(0)}$ of 0 W is common for the pulse oscillation.

Figure 11:
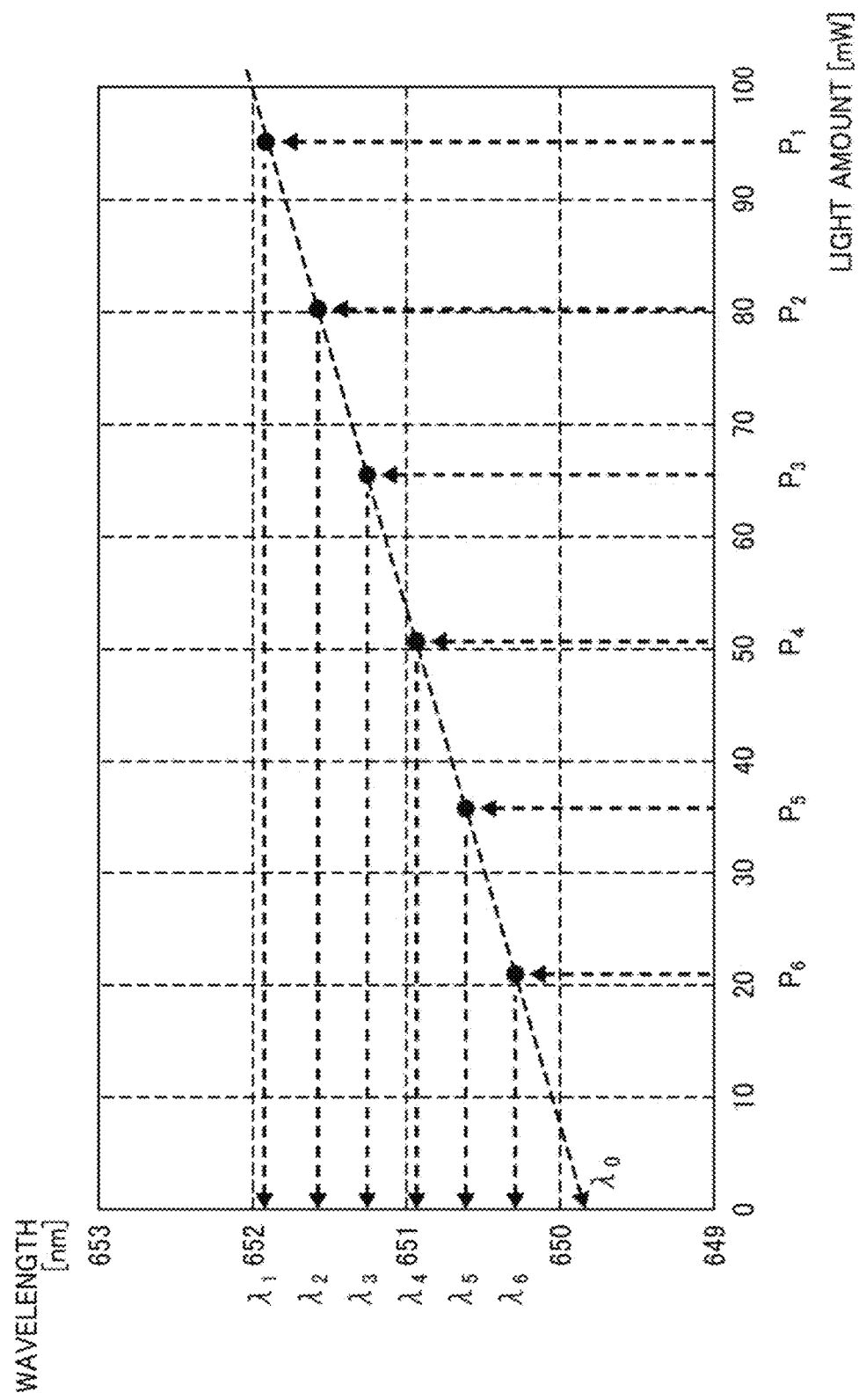
FIG. 11 is an illustration of how to determine a reference wavelength.

As a matter of course, it is impossible to actually measure a wavelength with the amount of light emission $P^{(0)}$ of 0 W. As illustrated in FIG. 11, the amounts P1 through P6 of light emission of the semiconductor laser and the wavelengths λ1 through λ6 corresponding to the amounts P1 through P6 are linearly interpolated to obtain the virtual wavelength with the amount of light emission $P^{(0)}$ of 0 W. Thus, the obtained virtual wavelength is the reference wavelength $\lambda^{(0)}$. The ambient temperature is substantially constant within a very short period of time, and thus little errors in measurement occur.

In FIG. 11, the amount of light emission of the semiconductor laser is changed in six steps and the wavelengths are estimated for the respective steps. However, no limitation is intended therein. In some embodiments, the amount of light emission of the semiconductor laser may be changes in at least two steps to measure the wavelength for each phase. Most of the LDs provide very good linearity, and thereby a reference wavelength $\lambda^{(0)}$ can be determined by obtaining a point of intersection of the straight line that passes through, for example, two plots and the vertical axis. The two plots are obtained by measuring the wavelength in two steps (low amount of light emission and high amount of light emission).

Further, the semiconductor lasers having the same oscillation wavelength bandwidth (the same color) differ in oscillation wavelength within approximately ±5 nanometer (nm) between individuals. Accordingly, the reference wavelength $\lambda^{(0)}$ is preferably measured for an individual semiconductor laser.

On the other hand, the semiconductor lasers does not differ in temperature coefficient α and light-amount coefficient β between individuals, and thus the temperature coefficient α and the light-amount coefficient β are set to constant values for each color. In some embodiments, the temperature coefficient α and the light-amount coefficient β may be preliminarily measured for each semiconductor laser to write the measured values in the firmware of the wavelength estimation unit 700*a*, thus increasing the accuracy in estimating wavelengths.

The process for obtaining the reference wavelength $\lambda^{(0)}$ in FIG. 11 is performed for each semiconductor laser using a wavelength measuring device, such as a spectrum analyzer. The values of the obtained reference wavelength $\lambda^{(0)}$, ambient temperature $T_a^{(0)}$ when the reference wavelength $\lambda^{(0)}$ is measured, and amount $P^{(0)}$ of light emission when the reference wavelength $\lambda^{(0)}$ is measured are substituted into the above-described formula (1). Specifically, the values of the obtained reference wavelength $\lambda^{(0)}$, ambient temperature $T_a^{(0)}$ when the reference wavelength $\lambda^{(0)}$ is measured, and amount $P^{(0)}$ of light emission when the reference wavelength $\lambda^{(0)}$ is measured are written in the firmware of the wavelength estimation unit 700*a*.

The wavelength estimation unit 700*a* monitors the amounts $P_{moni}$(red), $P_{moni}$(green), and $P_{moni}$(blue) of light reception, of which light has been emitted from the semiconductor lasers 111R, 111G, and 111B at different timings and received by the light-receiving element 117*a* at the different timings. The wavelength estimation unit 700*a* further calculates the current amounts P(red), P(green), and P(blue) of light emission of the semiconductor lasers 111R, 111G, and 111B based on the monitor information. Specifically, the amount P(red) of light emission is determined by dividing the amount $P_{moni}$(red) of light reception by the light utilization efficiency η(red) (P(red)=$P_{moni}$(red)/η(red)). The amount P(green) of light emission is determined by dividing the amount $P_{moni}$(green) of light reception by the light utilization efficiency η(green) (P(green)=$P_{moni}$(green)/ηgreen)). The amount P(blue) of light emission is determined by dividing the amount $P_{moni}$(blue) of light reception by the light utilization efficiency η(blue) (P(blue)=$P_{moni}$(blue)/η(blue)).

The wavelength estimation unit 700*a* calculates the current wavelength λ of light emitted from each semiconductor laser based on information of the current ambient temperature $T_a$ detected by the temperature sensor 130 or the above-described detector, using the above-described formula (1). Then, the wavelength estimation unit 700*a* sends the calculation results to the power-balance determination unit 700*b*.

The power-balance determination unit 700*b* determines the amount of light emission of each semiconductor laser (each of 111B, 111G, and 111R) based on color for each pixel in image data and the current wavelengths of the semiconductor lasers 111B, 111G, and 111R, to obtain an appropriate power balance for generating light of the color. Then, the power-balance determination unit 700*b* sends the determined values to the modulated-signal generator 700*c*.

Figure 17:
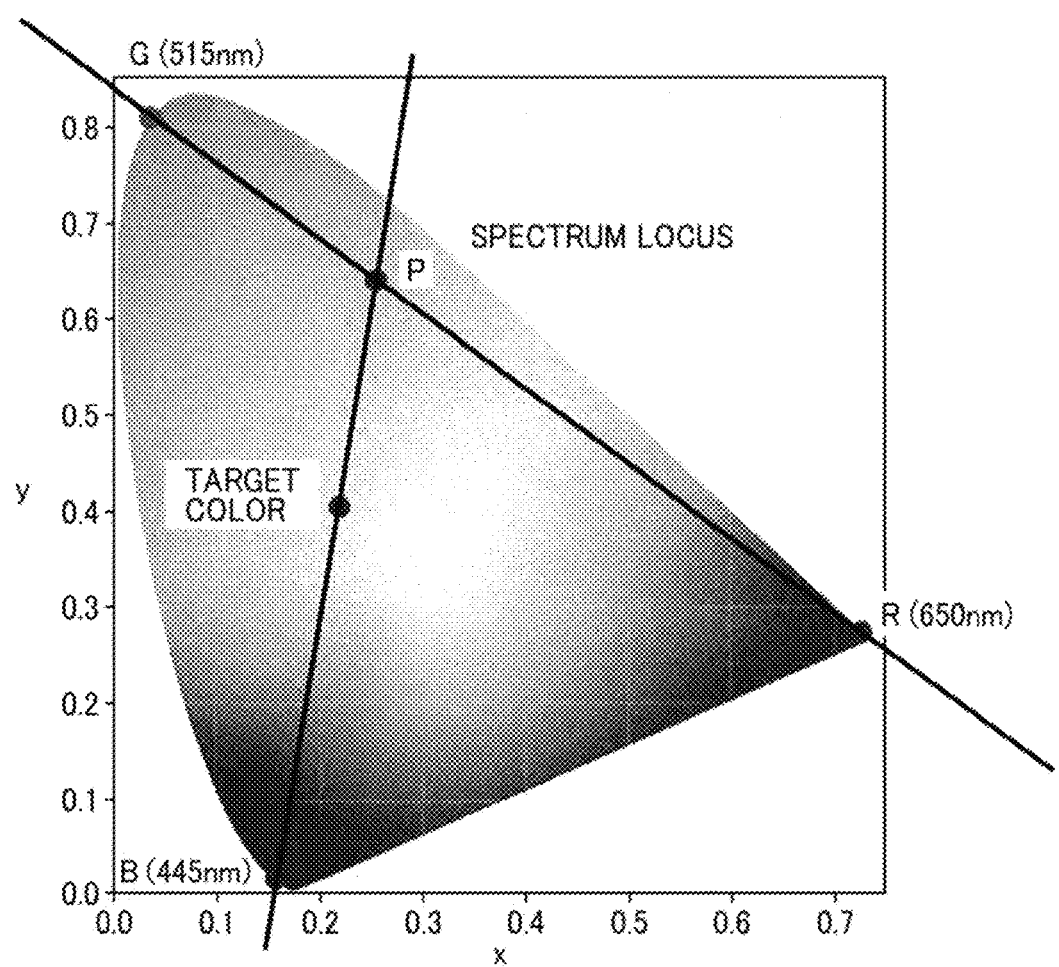
FIG. 17 is an illustration of a procedure for setting the amount of light emission for each semiconductor laser.

More specifically, the current wavelengths of light emitted from the semiconductor lasers 111R, 111G, and 111B are 650 nm, 515 nm, and 445 nm, respectively in the chromaticity coordinate as illustrated in FIG. 17 for example. In this case, the power-balance determination unit 700*b* appropriately determines the amounts of light emission of two of the semiconductor lasers 11R, 111G, and 111B and generates a color C. Then, the power-balance determination unit 700*b* determines an appropriate value for the amount of light emission of the remaining semiconductor laser according to the color C to obtain a desired color (target color). The power-balance determination unit 700*b* can generate any color within the triangle formed by three points of R (650 nm), G (515 nm), and B (445 nm) in FIG. 17. The horseshoeshaped edge line is referred to as a "spectrum locus" in which the wavelengths correspond to the colors.

The modulated-signal generator 700c generates a modulated signal for each light-emitting element (each of 111B, 111G, and 111R) based on the amounts of light emission of the respective light-emitting elements 111B, 111G, and 111R determined by the power-balance determination unit 700b and the image data. Then, the modulated-signal generator 700c outputs the generated signals to the LD driver 6111 at a predetermined timing according to the output signal of the scanning photodetector 60.

This configuration allows adjusting the power balance of light emitted from the three light-emitting elements 111B, 111G, and 111R to generate combined light of a desired color, and further allows the generated combined light to scan the imaging area, thereby displaying a virtual image of the desired color.

Thus, the configuration according to the present embodiment can display a high-quality color virtual image, in which color information for each pixel in the image data is faithfully reproduced.

In the above-described embodiments, a description was given of the color for a virtual image. To adjust the brightness of a virtual image, the amount of light emission of each light-emitting element (each of 111B, 111G, and 111R) is uniformly increased or reduced while maintaining a constant ratio between the determined amounts of light emission of the light-emitting elements 111B, 111G, and 111R. Thus, a desired color and a desired brightness can be obtained for the virtual image.

Hereinafter, a description is given of a light-source control process according to the present embodiment, referring to FIG. 12.

Figure 12:
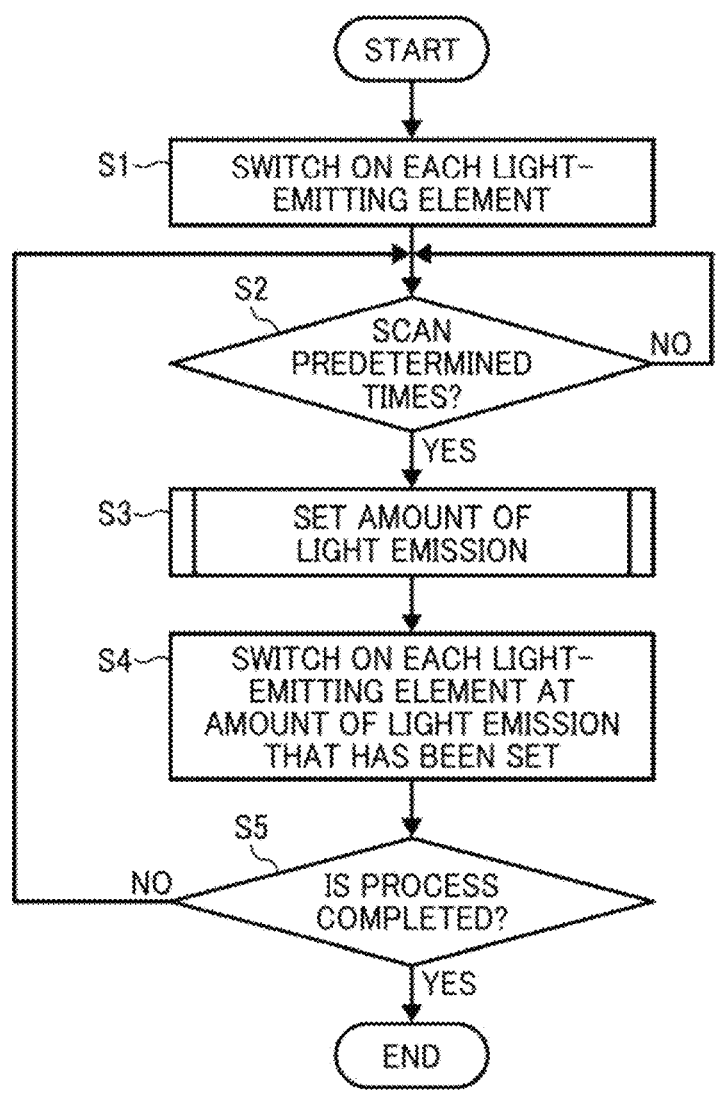
FIG. 12 is a flowchart of a light-source process.

FIG. 12 is a flowchart of a series of computational algorithms executed by the LD control circuit 700 according to the present embodiment. The light-source control processing starts when the electrical system of, for example, a vehicle mounted with the HUD 100 is turned on and the HUD 100 is executed. When the HUD 100 starts up, the optical deflector 15 starts operating.

In the first step S1, each of the light-emitting elements 111B, 111G, and 111R emits light. Specifically, the modulated-signal generator 700c generates a modulated signal for each light-emitting element (each of 111B, 111G, and 111R) according to the color for each pixel in the image data, and outputs the generated signals to the LD driver 6111 at a predetermined timing according to the output signal of the scanning photodetector 60. Accordingly, the LD driver 6111 applies a drive current according to the modulated signal for each of the light-emitting elements 111B, 111G, and 111R to the light-emitting elements 111B, 111G, and 111R. Then, drawing an image according to image data in the screen 30 and displaying a virtual image start.

In the next step S2, the HUD 100 determines whether scanning has been performed a predetermined number of times. More specifically, the HUD 100 counts the number of two-way scans or one-way scans in the main scanning direction based on the output signal of the scanning photodetector 60 and the horizontal scanning frequency of the optical deflector 15. When the counted number of scans reaches a predetermined number of times, the process goes to the next step S3. That is, the HUD 100 waits until the number of scans reaches the predetermined number of times. The "predetermined number of times" may be one two-way scan or at least the number of two-way scans for one frame on a two-way scan basis, or may be a one-way scan or at least the number of one-way scans for one frame on a one-way scan basis.

In step S3, a "light-emission-amount setting step" is performed. A detailed description is given later of the light-emission-amount setting step.

In the next step S4, each of the light-emitting elements 111B, 111G, and 111R emits light by the determined amount of light emission. Specifically, the HUD 100 causes each of the light-emitting elements (111B, 111G, and 111R) to emit light by the amount of light emission that has been determined in step S3. This allows for an appropriate power balance between light rays (emitted light) emitted from the three light-emitting elements 111B, 111G, and 111R and for the display of a virtual image of a desired color.

In the next step S5, the HUD 100 determines whether the process is completed. When the electrical system of the vehicle mounted with the HUD 100 is turned on, a negative determination is made in step S5 and the process return to step S2. In contrast, when the electrical system of the vehicle is turned off, an affirmative determination is made in step S5 and the process is completed.

In the above-described light-source control processing in step S2, the HUD 100 determines whether a predetermined number of scans have been performed. Alternatively, the HUD 100 may determine whether a predetermined time period has passed.

The following describes the "light-emission-amount setting step" in step S3 in the above-described light-source control processing.

Figure 13:
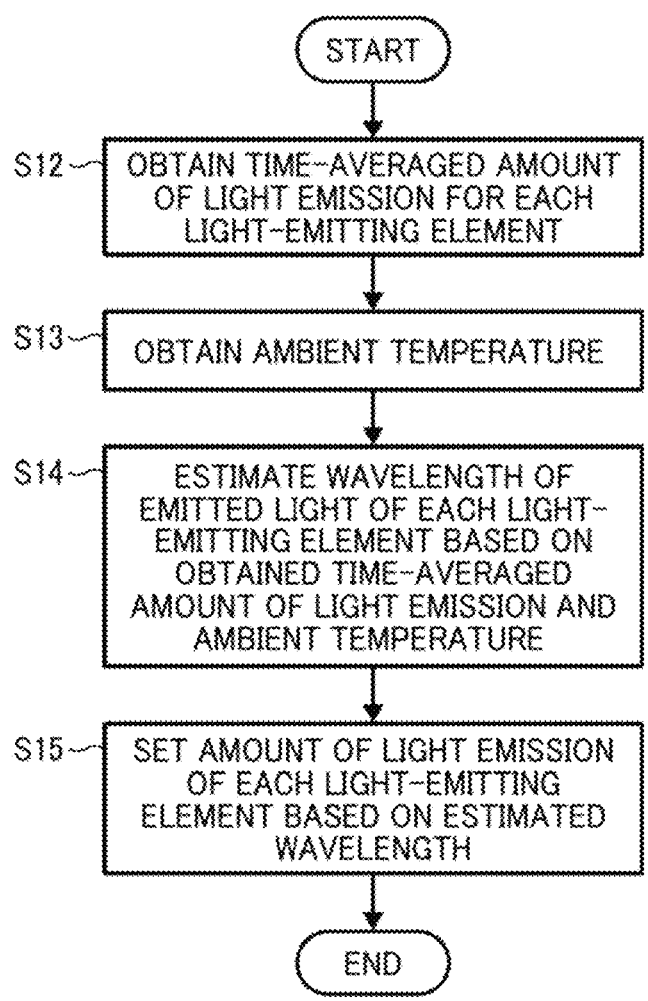
FIG. 13 is a flowchart of a light-emission-amount setting process.

FIG. 13 is a flowchart of a series of computational algorithms executed by the LD control circuit 700 according to the present embodiment. The light-emission-amount setting step is performed during a time period in which the effective scanning area (the imaging area) is not scanned with a scanning beam (a tune period in which an image is not drawn), when the peripheral area of the imaging area is scanned with the scanning beam, and during the transition time between the continuous frames.

In the first step S12, the HUD 100 acquires a time-averaged amount of light emission of each of the light-emitting elements 111B, 111G, and 111R. More specifically, the HUD 100 causes the light-emitting elements 111B, 111G, and 111R to sequentially emit light, and acquires, from the signal processing unit 120, a time-averaged signal of a light-receiving signal for each light emission.

In the next step S13, the HUD 100 acquires the ambient temperature of the semiconductor laser detected by the temperature sensor 130.

In the next step S14, the HUD 100 estimates the wavelength $\lambda$ of light emitted from each of the light-emitting elements 111B, 111G, and 111R based on the temporally-averaged amount of light (the current amount of light emission) and the ambient temperature of the semiconductor laser (the current ambient temperature). Specifically, the above-described formula (1) is used to estimate the wavelength $\lambda$.

In the next step S15, the HUD 100 determines the amount of light emission of each of the light-emitting elements 111B, 111G, and 111R.

Figure 14:
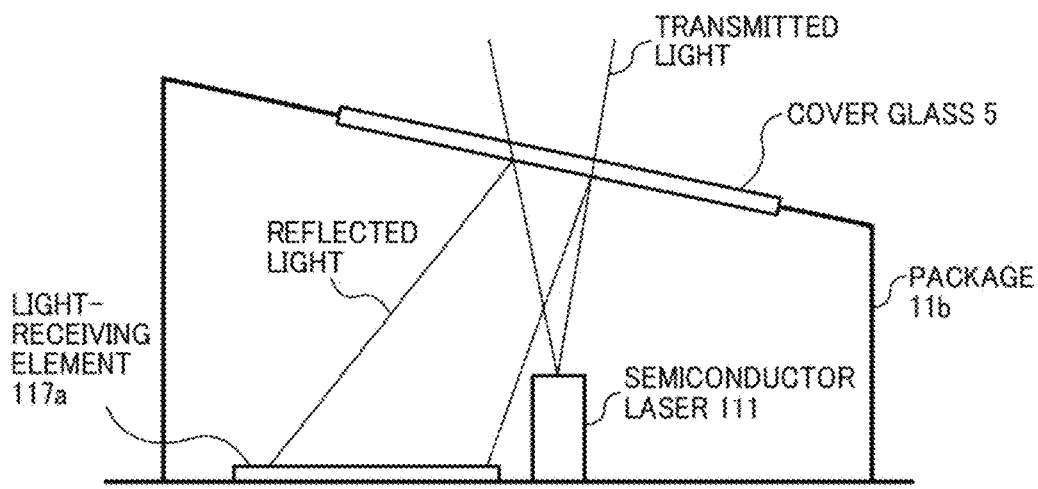
FIG. 14 is an illustration of an arrangement of a light-receiving element in a package containing a semiconductor laser according to variation 1.
Figure 15:
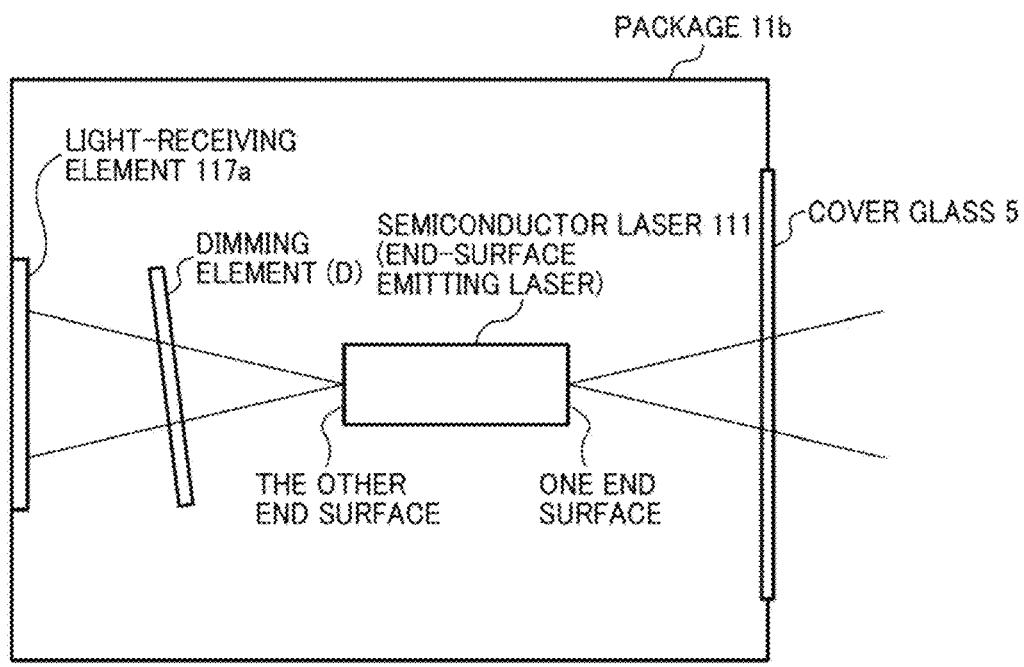
FIG. 15 is an illustration of an arrangement of a light-receiving element in a package containing a semiconductor laser according to variation 2.

In the present embodiment, the light-receiving element is disposed outside the package 11b that contains the semiconductor laser. In variations 1 and 2 as illustrated in FIGS. 14 and 15, the light-receiving element may be disposed in the interior of the package 11b that contains the semiconductor laser.

A high-power semiconductor laser is demanded for use in the HUD, and therefore a back-light monitor system adopted in the low-power semiconductor laser has difficulties in being directly used in the HUD.

Accordingly, the HUD 100 according to the above-described embodiment combines light beams emitted from a plurality of semiconductor lasers, separates the combined light beams, and guides one of the separated light beams to the light-receiving element 117a.

In this case, the other one of the separated light beams, which is guided to a virtual image of the HUD 100, might lose the amount of light.

Accordingly, using the light source 110 built in the light-emitting element according to variations 1 and 2 can prevent or reduce such a trouble.

According to variation 1 as illustrated in FIG. 14, the semiconductor laser emits a light beam, and the light beam passes through the cover glass (light-transmission window member), which surrounds and covers the opening of the package 11b, to separate into transmitted light and reflected light. The reflected light is received by the light-receiving element.

In variation 2, which adopts the back-light monitor system as illustrated in FIG. 15, the semiconductor laser emits light from one end surface, and the emitted light passes through the cover glass to exit the package 11b. The semiconductor laser also emits light from the other end surface, and the emitted light passes through a dimming element D (a neutral-density (ND) filter) to enter the light-receiving element, thus preventing the saturation of amount of light in the light-receiving element.

According to variations 3 and 4, in which the light sources according to variations 1 and 2 are prepared for three colors, red, green, and blue, a light-receiving element is disposed for each light source. This configuration allows the light-emitting elements of the respective light source 110 to emit light at the same time and allows the light-receiving element to simultaneously receive the light emitted from the light-emitting elements in the above-described light-source control processing and light-emission-amount setting processing. This further allows setting the amount of light emission in a shorter time.

Figure 16:
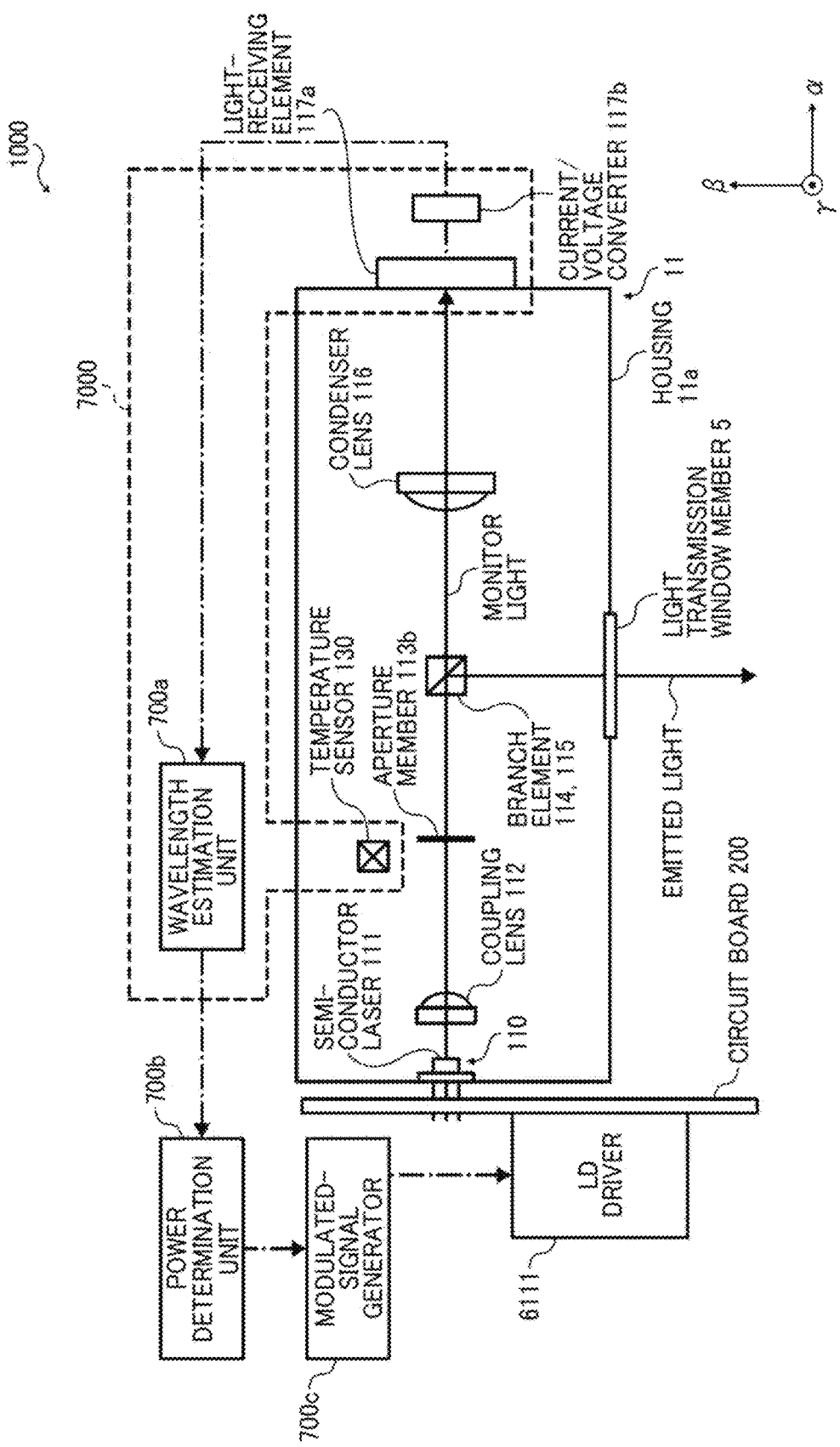
FIG. 16 is an illustration of the light-source device including a single semiconductor laser.

In the wavelength estimation method according to the above-described embodiment and each variation, the cases in which the light-source device 1000 including a plurality of light sources are used is described. Alternatively, in variation 5 as illustrated in FIG. 16, a light-source device 1000 including a single light source 110 is applicable. In the case of using a single light source 110 as well, the wavelength of emitted light can be accurately estimated, thereby accurately setting (determining) the amount of light emission of the light source. The light-source device 1000 including a single light source 110 (for example, a semiconductor laser) may be applied, for example, to an image display apparatus for displaying a monochrome image, a laser beam machine, a laser annealing device, and a laser ignition plug.

In such a case, the wavelength estimation unit estimates the wavelength of light emitted from the light source, a power determination unit determines the amount of light emission based on the estimation results. A modulated-signal generator generates a modulated signal based on the determination results, and the LD driver causes the light source 110 to emit light with a desired amount of light emission.

The image display apparatus according to the embodiments of the present disclosure is applicable not only to the HUD but also to, for example, a head-mounted display, a prompter, and a projector. In this case as well, an image of a desired color can be displayed.

For example, in the case that the image display is applied to a projector, the projector can be configured in the same manner as in the HUD 100. In other words, image light is projected onto a projection screen or a wall through the concave mirror 40. Alternatively, image light may be projected onto a projection screen or a wall through the screen 30 without the concave mirror 40. In alternative to the concave mirror 40, any desired free-form surface mirror may be provided.

The light-source device 1000 including the light source 110 and the wavelength estimation device 7000 according to the present disclosure may be used as an exposure light source 110 of an image forming apparatus, such as a color printer or a color copier, to expose, for example, a photoconductor and form an image. In this case as well, an image of a desired color can be formed.

In the description above, the wavelength of light emitted from the semiconductor is estimated based on both the ambient temperature dependence and the self-temperature dependence of the wavelength of the emitted light. In variation 6 in which the ambient temperature of the semiconductor laser is considered substantially constant, the wavelength of the emitted light may be estimated based only on the self-temperature dependence (only the amount of light received by the light-receiving element 117a or the average light amount). In this case, the temperature sensor 130 and the above-described detector may not be disposed in the HUD 100.

In variation 6, the environment that "the ambient temperature of the semiconductor laser is considered substantially constant" is assumed to be the case in which the temperature in the interior of the vehicle mounted with the HUD 100 is maintained substantially constant by air conditioning or the case in which the temperature in the room is maintained substantially constant by air conditioning when the head-mounted display, the prompter, or the projector as the image display apparatus including the light-source device 1000 with the light source 110 and the wavelength estimation device 7000 according to the present disclosure is used in the room.

Specifically, using formula (2) below allows for the estimation of the wavelength of the emitted light.

$$\lambda = \lambda^{(0)} + \beta \times (P - P^{(0)}) \qquad (2),$$

where
$\lambda$ is the current wavelength,
$\lambda^{(0)}$ is the reference wavelength,
$\beta$ is the light-amount coefficient,
P is the current amount of light emission, and
$P^{(0)}$ is the amount of light emission when the reference wavelength is measured.

Using formula (2) can obtain the reference wavelength $\lambda^{(0)}$ same as in the above-described embodiment (refer to FIG. 11). In this case, the estimation target wavelength of the semiconductor laser that oscillates in the multi-longitudinal mode may be, for example, the above-described weighted-average wavelength, or may be the wavelength of the peak intensity.

The wavelength estimation device 7000 according to the above-described embodiment and each variation, which estimates the wavelength of light emitted from a light source, includes the light detector 117 to receive the light emitted from the light source 110 and the wavelength estimation unit 700a to estimate the wavelength of the light emitted from the light source 110 based on the amount of light emission at the light detector 117.

This configuration can accurately estimate the wavelength without introducing the method (for example, the superheterodyne method that uses a light band-pass filter) for directly measuring the wavelength of light emitted from the light source.

Such a simplified configuration can accurately estimate the wavelength of light emitted from the light source.

Preferably, the wavelength estimation device 7000 according to the above-described embodiment and each variation further includes a signal processing unit to temporally average a signal according to the amount of light emission at the light detector 117. The wavelength estimation unit 700a preferably estimates the wavelength of light emitted from the light source 110 based on the signal temporally averaged by the signal processing unit.

This configuration can more accurately estimate the wavelength of light emitted from the light source.

Preferably, the wavelength estimation device 7000 according to the above-described embodiment and variations 1 through 5 further includes a detector the temperature sensor 130 and the above-described detector) to detect the ambient temperature of the light source 110 (the light-emitting element 111B, 111G, or 111R). The wavelength estimation unit 700a preferably estimates the wavelength of light emitted from the light source 110 based on the amount of light emission and the ambient temperature detected by the detector.

This configuration can more accurately estimate the wavelength of light emitted from the light source.

Further, the above-described formula (1): $\lambda=\lambda^{(0)}+\alpha\times(T_a-T_a^{(0)})+\beta\times(P-P^{(0)})$ is preferably satisfied. where $\lambda$ is the current wavelength, $\lambda^{(0)}$ is the reference wavelength, $\alpha$ is temperature coefficient, $T_a$ is the current ambient temperature, $T_a^{(0)}$ is the ambient temperature when the reference wavelength is measured, $\beta$ is the light-amount coefficient, $P$ is the current amount of light emission, and $P^{(0)}$ is the amount of light emission when the reference wavelength is measured.

In this case, the reference wavelength $\lambda^{(0)}$ is preferably defined as a virtual wavelength with an amount of light emission $P^{(0)}$ of 0 watt (W).

Preferably, the light source 110 to includes a semiconductor laser that oscillates in the multi-longitudinal mode, and the reference wavelength $\lambda^{(0)}$ is a wavelength obtained by weighted-averaging a wavelength component having an intensity ranging from Id through −20 decibel (dB) in the multi-longitudinal mode where Id is the value of the peak intensity.

The light-source device 1000 includes the light sources with the light-emitting elements 111B, 111G, and 111R and the wavelength estimation device 7000 according to the above-described embodiment and each variation to estimate the wavelengths of light emitted from the light sources. The light-source device 1000 according to the present disclosure can accurately estimate the wavelengths of light emitted from the light sources and appropriately adjust the amounts of light emission of the light sources based on the estimation result. Thus, the HUD 100 according to the present disclosure can reproducibly generate light of a desired color.

Preferably, the light-source device 1000 further includes a LD driver 6111 (drive circuit) to drive the light source. The temperature sensor 130 is preferably disposed at a position where the ambient temperature to be detected is insusceptible to heat generated by the LD driver.

The light-source device according to the above-described embodiment and variation 6 includes a plurality of (for example, three) light sources that includes light-emitting elements having different light-emission wavelength bandwidths. The light-source device 1000 further includes an optical system to combine light beams emitted from the plurality of light sources and separate the combined light beams. The light-receiving element is disposed in the optical path of the separated light beams traveling from the optical system. The light-source device 1000 further includes a light-emission-amount setting unit to set the amounts of light emission of the plurality of light-emitting elements based on the wavelengths, which have been measured by the wavelength estimation device, of light emitted from the plurality of light sources.

According to the above-described variations 1 and 3, the light source 110 further includes a package 11b (container) that includes a cover glass (light-transmission window member). The cover glass allows the light emitted from the semiconductor laser contained in the package 11b to separate into transmitted light and reflected light. The light-receiving element of the wavelength estimation device is contained in the package 11b to receive the reflected light.

According to the above-described variations 2 and 4, the light-emitting element is an end-surface light-emitting semiconductor laser. The light-emitting element further includes a package 11b (container) containing the semiconductor laser and having a cover glass. The semiconductor laser emits light from one end surface, and the light passes through the cover glass to exit the package 11b. The light-receiving element of the wavelength estimation device is contained in the package 11b such that the light-receiving element can receive light emitted from the other end surface of the semiconductor laser.

In the above-described variations 2 and 4, a dimming element D is preferably disposed between the other end surface of the semiconductor laser and the light-receiving element in the package 11b.

The light-source device 1000 according to the above-described variations 3 and 4 includes a plurality (for example, three) of light sources described above, each including a light-emitting element (semiconductor laser) having a different light-emission wavelength bandwidth. The light-source device 1000 further includes a light-amount-emission setting unit to set the amounts of light emission of a plurality of semiconductor lasers based on the wavelengths, which have been estimated by the wavelength estimation device, of light emitted from the plurality of semiconductor lasers.

The HUD 100 includes the light-source device 1000, the optical deflector 15 (image forming element) to form an image using light emitted from the light-source device 1000, and the screen 30 irradiated with the light that has formed the image. The HUD 100 can draw an image on the screen 30 with a successful color reproduction.

The HUD 100 further includes a concave mirror 40 (projector) to project light toward a front window 50 (transmission and reflection member) through the screen 30. The mobile device that includes the HUD 100 and a vehicle mounted with the HUD 100 allows displaying a virtual image with high visibility to a driver.

The wavelength estimation method according to the above-described embodiment and each variation includes receiving light emitted from a light source 110 and estimating the wavelength of the light emitted from the light source 110 based on the reception result in the receiving light to measure the wavelength of the light emitted from the light source.

This configuration can accurately estimate the wavelength without introducing the method (for example, the superheterodyne method that uses a light band-pass filter) for directly measuring the wavelength of light emitted from the light source.

Such a simplified configuration can accurately estimate the wavelength of light emitted from the light source.

The wavelength estimation method according to the above-described embodiment and variations 1 through 5 further includes detecting the ambient temperature of the light source 110 to estimate the wavelength of the light emitted from the light source 110 based on the detection result in the detecting and the reception result.

This configuration can more accurately estimate the wavelength of light emitted from the light source.

The light-source controlling method according to the above-described embodiment and variations 3, 4, and 6 includes turning on a plurality of light source 110 to emit light, receiving the light emitted from the plurality of light sources, estimating the wavelength of the light emitted from the plurality of light sources based on the reception result in the receiving, and setting the amounts of light emission of a plurality of semiconductor lasers to control the plurality of light sources having different wavelengths.

In this case as well, light of a desired color can be formed with a successful color reproduction.

The light-source controlling method according to the above-described embodiment and variations 1 through 5 further includes detecting the ambient temperature of the light source 110 to estimate the wavelength of the light emitted from the light source 110 based on the detection result in the detecting and the reception result.

In this case as well, light of a desired color can be generated with a successful color reproduction.

For example, the light-source device 1000 according to the above-described embodiment and variations 5 and 6 may include a plurality of light-receiving elements for at least one light source. More specifically, the light-source device 1000 may separate a light beam emitted from at least one light source and allow a light-receiving element to receive one of the separated light beams corresponding to the light-receiving element while allowing the other of the separated light beams to be combined for displaying an image.

In the above-described embodiments, the projector is a concave mirror 40. However, the present disclosure is not limited to the configuration, and the projector may be a convex surface.

In the example embodiment described above, the HUD 100 includes the scanning mirror 20, but may not include the scanning mirror 20. In other words, the HUD 100 may allow light deflected by the optical deflector 15 to directly go to the screen 30 or to pass through the convex lens and go to the screen 30. In alternative to the scanning mirror 20, any desired planar mirror may be provided.

In the above-described embodiment and each variation, the LD is used as the light emitting element 111. Alternatively, examples of the light-emitting element may include another type of laser, such as a vertical-cavity surface-emitting laser (VCSEL), the LED, an organic electroluminescence (EL) element, and a white light source.

Moreover, the transmission and reflection member is not limited to the front window of the mobile object, but may be a different window (window), such as a side glass and a rear glass. That is, the transmission and reflection member is disposed in the mobile object for the visual recognition of the outside of the mobile object.

In the above-described embodiment and each variation, cases in which the image display apparatus (HUD) is provided for a mobile object such as a vehicle, an aircraft, a ship, and a mobile object, such as a robot, were described. However, no limitation is indicated thereby, and modification may be made as long as the image display apparatus is provided for an object. The term "object" includes not only a mobile object but also an object that is located on a permanent basis or an object that is transportable.

The wavelength estimation device, light-source device, image display apparatus, and object apparatus according to the present disclosure are not limited to the configurations according to the above-described embodiment and each variation, and are variable as appropriate.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A wavelength estimation device, comprising:
a light detector to receive unfiltered light emitted from a light source;
a detector to detect an ambient temperature of the light source; and
processing circuitry configured to estimate an oscillation wavelength of the unfiltered light when emitted from the light source, based on an amount of the unfiltered light received by the light detector,
wherein the processing circuitry is further configured to estimate the oscillation wavelength of the light based on the amount of light received by the light detector and the ambient temperature detected by the detector.

2. The wavelength estimation device according to claim 1, further comprising a signal processor to temporally average a signal according to the amount of light received by the light detector to generate an average amount of light received by the light detector,
wherein the processing circuitry is further configured to estimate the oscillation wavelength of the light based on the generated average amount.

3. The wavelength estimation device according to claim 1, wherein the processing circuitry is configured to estimate the oscillation wavelength of the light based on a formula of $\lambda = \lambda^{(0)} + \alpha \times (T_a - T_a^{(0)}) + \beta \times (P - P^{(0)})$,
where
$\lambda$ is the wavelength of the light,
$\lambda^{(0)}$ is a reference wavelength,
$\alpha$ is a temperature coefficient,
$T_a$ is a current ambient temperature,
$T_a^{(0)}$ is an ambient temperature on measurement of the reference wavelength,
$\beta$ is light-amount coefficient,
P is a current amount of light emission, and
$P^{(0)}$ is an amount of light emission on measurement of the reference wavelength.

4. The wavelength estimation device according to claim 1, wherein the reference wavelength $\lambda^{(0)}$ is a virtual wavelength with $P^{(0)}$ being 0 W.

5. The wavelength estimation device according to claim 3, wherein the light source includes a semiconductor laser that oscillates in a multi-longitudinal mode, and
wherein the reference wavelength is a wavelength obtained by weighted-averaging wavelength components having intensities ranging from Id to an intensity of −20 decibel (dB) relative to Id,
where Id is a peak intensity of the light emitted by the semiconductor laser.

6. A light-source device, comprising:
the light source including a light-emitting element to emit light; and
the wavelength estimation device according to claim 1, which is configured to estimate the oscillation wavelength of the light when emitted from the light-emitting element.

7. The light-source device according to claim 6, further comprising a drive circuit to drive the light source,
wherein the detector of the wavelength estimation device includes a temperature sensor disposed at a position at which an ambient temperature detected by the temperature sensor is insusceptible to heat generated by the drive circuit.

8. The light-source device according to claim 6, further comprising:
a plurality of light sources constituted by the light source and at least another light source, the plurality of light sources including a plurality of light-emitting elements having different light-emission wavelength bandwidths; and
an optical system to combine light emitted from the plurality of light sources and separate the combined light, wherein
the processing circuitry is further configured to set amounts of light emission of the plurality of light-emitting elements based on wavelengths of the light emitted from the plurality of light sources, the wavelengths having been estimated by the wavelength estimation device,
wherein the light detector of the wavelength estimation device is disposed in an optical path of light separated by the optical system.

9. The light-source device according to claim 6,
wherein the light-emitting element is disposed in a housing including a light-transmission window member,
wherein the light-transmission window member separates light emitted from the light-emitting element into transmitted light and reflected light, and
wherein the light detector of the wavelength estimation device includes a light-receiving element disposed in the housing to receive the reflected light.

10. The light-source device according to claim 9, further comprising:
a plurality of light sources constituted by the light source and at least another light source, the plurality of light sources including a plurality of light-emitting elements having different light-emission wavelength bandwidths; and
a plurality of light detectors corresponding to the plurality of light-emitting elements, wherein the processing circuitry is further configured to set amounts of light emission of the plurality of light-emitting elements based on wavelengths of the light emitted from the plurality of light-emitting elements, the wavelengths having been estimated by the wavelength estimation device.

11. The light-source device according to claim 6,
wherein the light-emitting element is an end-surface light-emitting semiconductor laser having a first end surface and a second end surface,
wherein the semiconductor laser is disposed in a package including a light-transmission window member through which light emitted from the first end surface of the semiconductor laser passes to an outside of the package, and
wherein the light detector of the wavelength estimation device includes a light-receiving element disposed in the package to receive light emitted from the second end surface of the semiconductor laser.

12. The light-source device according to claim 11, further comprising a dimming element disposed in an optical path between the second end surface of the semiconductor laser and the light-receiving element in the package.

13. An image display apparatus comprising:
the light-source device according to claim 6,
an image forming element to form an image by light emitted from the light-source device; and
a screen to be irradiated with the light forming the image.

14. An object apparatus comprising:
the image display apparatus according to claim 13, further including a projector to project light having passed through the screen to a light-transmission window member; and
an object mounted with the image display apparatus.

15. The object apparatus according to claim 14, wherein the object is a mobile object.

16. A wavelength estimation method, comprising:
receiving unfiltered light emitted from a light source;
detecting an ambient temperature of the light source; and
estimating an oscillation wavelength of the unfiltered light when emitted from the light source based on an amount of the unfiltered light received in the receiving step,
wherein the estimating step includes estimating the oscillation wavelength based on the received amount of light and the detected ambient temperature.

17. A light-source control method, comprising
turning on a plurality of light sources having different light-emission wavelength bandwidths to emit light;
detecting an ambient temperature of the plurality of light sources;
receiving, by a light detector, the light emitted from the plurality of light sources, the received light being unfiltered;
estimating oscillation wavelengths of the unfiltered light when emitted from the plurality of light sources based on an amount of the unfiltered light received in the receiving step; and
setting amounts of light emission of the plurality of light sources based on an estimation result of the estimating step,
wherein the estimating step includes estimating the oscillation wavelengths based on the received amount of light and the detected ambient temperature.

* * * * *